US012684803B2

(12) United States Patent　　　　　(10) Patent No.:　US 12,684,803 B2
Tsai et al.　　　　　　　　　　　　　　(45) Date of Patent:　　Jul. 14, 2026

(54) SEMICONDUCTOR DEVICE AND METHOD OF MANUFACTURING THE SAME

(71) Applicant: Taiwan Semiconductor Manufacturing Company, Ltd., Hsin-Chu (TW)

(72) Inventors: Yuan Tsung Tsai, Tainan City (TW); Yao Jui Kuo, Tainan City (TW); Chia-Wei Fan, Tainan City (TW); Ying Ming Wang, Tainan City (TW); Shih-Hao Chen, Hsinchu County (TW); Ling-Sung Wang, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 365 days.

(21) Appl. No.: 18/417,813

(22) Filed: Jan. 19, 2024

(65) Prior Publication Data

US 2025/0081508 A1　　Mar. 6, 2025

Related U.S. Application Data

(60) Provisional application No. 63/579,362, filed on Aug. 29, 2023.

(51) Int. Cl.
| | |
|---|---|
| *H01L 29/78* | (2006.01) |
| *H01L 29/417* | (2006.01) |
| *H01L 29/66* | (2006.01) |
| *H10D 30/01* | (2025.01) |
| *H10D 30/62* | (2025.01) |

(52) U.S. Cl.
CPC ........... H10D 30/62 (2025.01); H10D 30/024 (2025.01); H10D 30/6219 (2025.01)

(58) Field of Classification Search
CPC .. H10D 30/62; H10D 30/024; H10D 30/6219; H10D 30/6217
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,522,682 | B2 * | 12/2019 | Yoon ...................... H10D 30/62 |
| 2021/0305420 | A1 | 9/2021 | Frougier et al. |

FOREIGN PATENT DOCUMENTS

| | | |
|---|---|---|
| TW | 202322352 A | 9/2021 |
| TW | 202322220 A | 6/2023 |

* cited by examiner

*Primary Examiner* — Leonardo Andujar
(74) *Attorney, Agent, or Firm* — HAYNES AND BOONE, LLP

(57)　　　　ABSTRACT

A semiconductor device and method of manufacturing the same are provided. The semiconductor device includes a first fin and a gate electrode. The first fin extends along a first direction. The gate electrode has a sidewall extending along a second direction different from the first direction. The sidewall of the gate electrode defines an indentation adjacent to the first fin in a top view.

20 Claims, 22 Drawing Sheets

10a 116
110

112-1

112-2

112-3

Z
Y
X

SEMICONDUCTOR DEVICE AND METHOD OF MANUFACTURING THE SAME

CROSS-REFERENCE TO RELATED APPLICATIONS

This application claims the benefit of U.S. Provisional Application No. 63/579,362, filed Aug. 29, 2023, the entire disclosure of which is incorporated by reference herein.

BACKGROUND

Technological evolution of integrated circuit (IC) materials and design has resulted in smaller and more complex circuits each generation. In the course of such IC evolution, functional density (i.e., the number of interconnected devices per chip area) has generally increased while geometric size (i.e., the smallest component (or line) that may be created using a fabrication process) has decreased. This scaling down provides benefits of increased production efficiency and lower associated costs.

The noted scaling down has further increased the complexity of IC manufacture, such that for the advances to be fully realized, corresponding developments in IC manufacture are needed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
FIG. 1A, FIG. 1B, FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, and FIG. 9B illustrate various stages of manufacturing a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain error necessarily resulting from the standard deviation found in the respective testing measurements. Also, as used herein, the terms "substantially," "approximately" and "about" generally mean within a value or range that can be contemplated by persons having ordinary skill in the art. Alternatively, the terms "substantially," "approximately" and "about" mean within an acceptable standard error of the mean when considered by one of ordinary skill in the art. Persons having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the like thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. The term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm. Ranges can be expressed herein as from one endpoint to another endpoint or between two endpoints. All ranges disclosed herein are inclusive of the endpoints, unless specified otherwise.

The present disclosure is related to semiconductor devices and fabrication methods. More particularly, the present disclosure is related to a semiconductor device with a modified dummy gate electrode profile, which prevents electrical shorts between a source/drain (S/D) feature and a gate electrode. Generally, a dummy gate electrode may have a bamboo structure which is a protruding portion of said dummy gate electrode protruding from the fin. During a stage of removing the dummy gate electrode, said bamboo structure may cause over etching and then the S/D feature is exposed and/or etched, which results in an electrical short between the S/D feature and the gate electrode subsequently formed. Over etching of the dummy gate electrode is prone to occur at the outer fin because of a loading effect. The present disclosure provides a method to modify the profile of the dummy gate electrode to avoid the aforementioned issues, and such modified profile of the dummy gate electrode can be inherited by the gate electrode.

Transistors formed using a replacement gate (or "gate-last") process and the methods of forming the same are provided in accordance with various exemplary embodiments. The intermediate stages of forming the transistors are illustrated in accordance with some embodiments. Some variations of some embodiments are discussed. In the illustrated exemplary embodiments, the formation of fin field-effect transistors (FinFETs) is used as an example to explain the concept of the present disclosure. Gate-all-around (GAA) transistors or planar transistors may also adopt the embodiments of the present disclosure.

FIGS. 1A to 9A and FIGS. 1B to 9B illustrate various stages of manufacturing a semiconductor device 10a, in accordance with some embodiments of the present disclosure, wherein FIGS. 1A to 9A are perspective views, and FIGS. 1B to 9B are top views of FIGS. 1A to 9A, respectively. It should be noted that some features are omitted from top views for brevity.

Figure 1B:
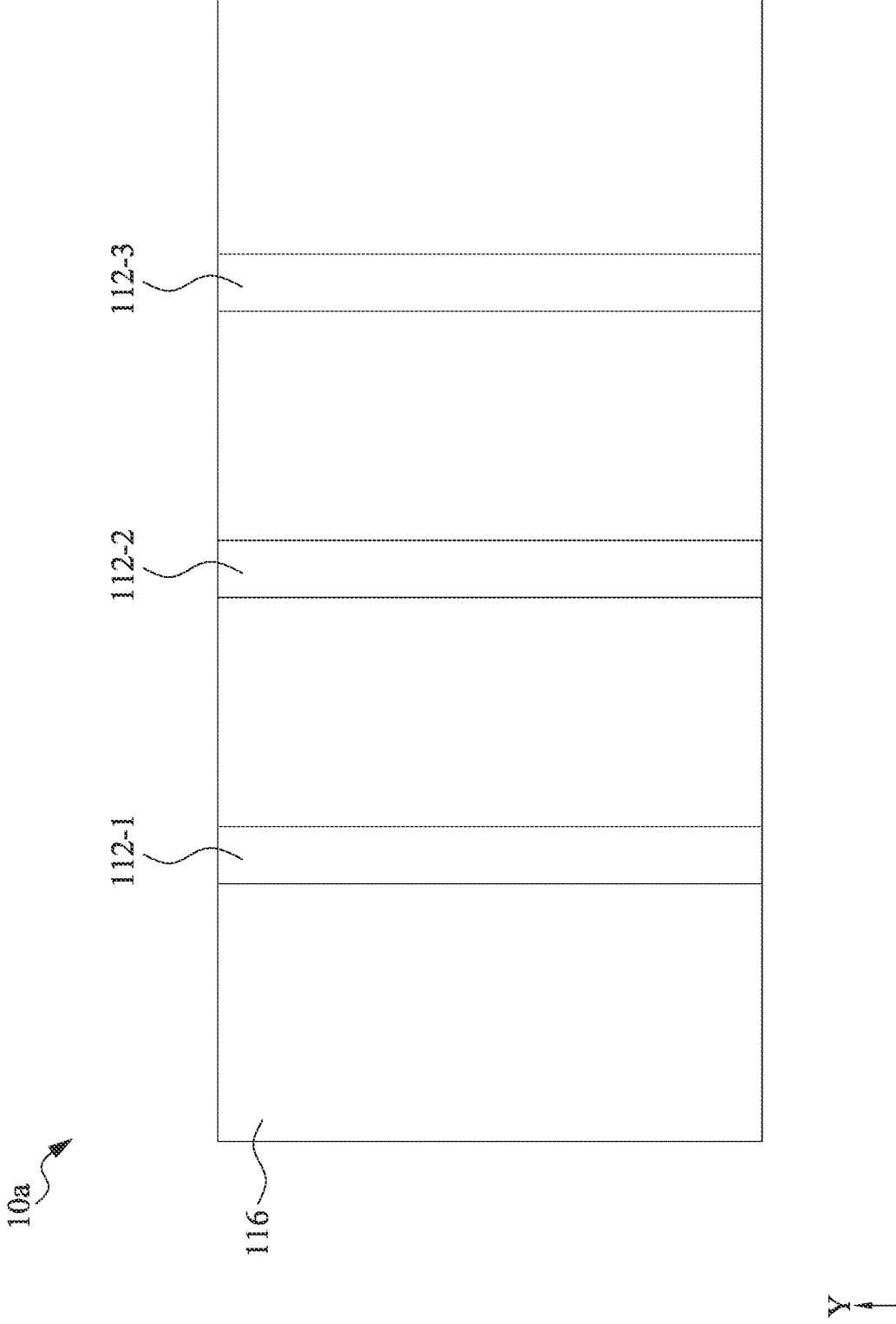

Referring to FIG. 1A and FIG. 1B, a substrate 110 is provided. In some embodiments, the substrate 110 is a semiconductor substrate, such as a bulk semiconductor substrate, a semiconductor-on-insulator (SOI) substrate, or the like, which may be doped (e.g., with a p-type or an n-type dopant) or undoped. The substrate 110 may be a semiconductor wafer, such as a silicon wafer. Generally, an SOI substrate includes a layer of a semiconductor material (e.g., silicon) formed on an insulator layer. The insulator layer may be, for example, a buried oxide (BOX) layer, a silicon oxide layer, or the like. The insulator layer is provided on a substrate, typically silicon or glass substrate. Other substrates, such as a multi-layered or gradient substrate, may also be used. In some embodiments, the semiconductor material of the substrate 110 may include or be made of silicon, germanium, a compound semiconductor including silicon carbide (SiC), gallium arsenic (GaAs), gallium phosphide (GaP), indium phosphide (InP), indium arsenide (InAs), and/or indium antimonide (InSb), an alloy semiconductor including SiGe, GaAsP, AlInAs, AlGaAs, GaInAs, GaInP, and/or GaInAsP, or combinations thereof.

Depending on design requirements, the substrate 110 may be a p-type substrate, an n-type substrate, or a combination thereof and may have doped regions therein. The substrate 110 may be configured for an NMOS device, a PMOS device, an n-type FinFET device, a p-type FinFET device, other kinds of devices (such as, multiple-gate transistors, gate-all-around transistors or nanowire transistors), or combinations thereof. In some embodiments, the substrate 110 for NMOS device or n-type FinFET device may include Si, SiP, SiC, SiPC, InP, GaAs, AlAs, InAs, InAlAs, InGaAs, or combinations thereof. The substrate 110 for PMOS device or p-type FinFET device may include Si, SiGe, SiGeB, Ge, InSb, GaSb, InGaSb, or combinations thereof.

The semiconductor device 10a includes fins 112-1, 112-2, and 112-3. Each of the fins 112-1, 112-2, and 112-3 protrudes from the upper surface (not annotated) of the substrate 110. Each of the fins 112-1, 112-2, and 112-3 extends along the Y-direction. In some embodiments, the fins 112-1, 112-2, and 112-3 are parts of the substrate 110, and hence the material of the fins 112-1, 112-2, and 112-3 is the same as that of substrate 110. In accordance with alternative embodiments, the fins 112-1, 112-2, and 112-3 are replacement strips formed by etching the portions of the substrate 110 to form recesses and performing an epitaxy technique to regrow another semiconductor material in the recesses. Accordingly, the fins 112-1, 112-2, and 112-3 are formed of a semiconductor material different from that of the substrate 110. For example, the fins 112-1, 112-2, and 112-3 include or be made of Si, SiP, SiC, SiPC, SiGe, SiGeB, Ge, or a III-V compound semiconductor such as InP, GaAs, AlAs, InAs, InAlAs, InGaAs, or the like.

The fins 112-1, 112-2, and 112-3 may be patterned by any suitable methods. For example, the fins 112-1, 112-2, and 112-3 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In some embodiments, the fins 112-1, 112-2, and 112-3 define or constitute a fin group, each of the fins 112-1 and 112-3 is an outer fin (or the outermost fin) of the fin group, and the fin 112-2 is an intra-fin of the fin group. As used herein, the term "fin group" indicates multiple fins arranged with a relatively small distance (or a pitch), wherein the distance of the abutting fins within the same fin group is much smaller than the distance between abutting fins belonging to different fin groups, which will be described later. Although FIG. 1A and FIG. 1B illustrate that the fin group of the semiconductor device 10a includes three fins, it should be noted that one fin group can include more fins in other embodiments. That is, a fin group can include two outer fins and multiple intra-fins therebetween.

The semiconductor device 10a includes an isolation region 116. The isolation region 116 includes a shallow trench isolation (STI) region, which may be formed to extend from the upper surface of the substrate 110. In some embodiments, the isolation region 116 includes a liner oxide (not shown), which may be a thermal oxide formed through a thermal oxidation of a surface layer of the substrate 110. The liner oxide may also be a deposited silicon oxide layer formed using, for example, atomic layer deposition (ALD), high-density plasma chemical vapor deposition (HDPCVD), chemical vapor deposition (CVD), or other suitable techniques. The isolation region 116 may also include a dielectric material over the liner oxide, wherein the dielectric material may be formed using flowable chemical vapor deposition (FCVD), spin-on, or the like. In some embodiments, a dielectric material is deposited to fill the recesses between fins (e.g., the fins 112-1, 112-2, and 112-3), and an etching technique is performed to remove a portion of the dielectric material such that the dielectric material is recessed from the top of the fins, which thereby forms the isolation region 116. The etching technique may be performed using a dry etching process, wherein $HF_3$ and $NH_3$ are used as the etching gases. In accordance with alternative embodiments of the present disclosure, the recessing of isolation region 116 is performed using a wet etch process. The etching chemical may include HF solution, for example.

Figure 2A:
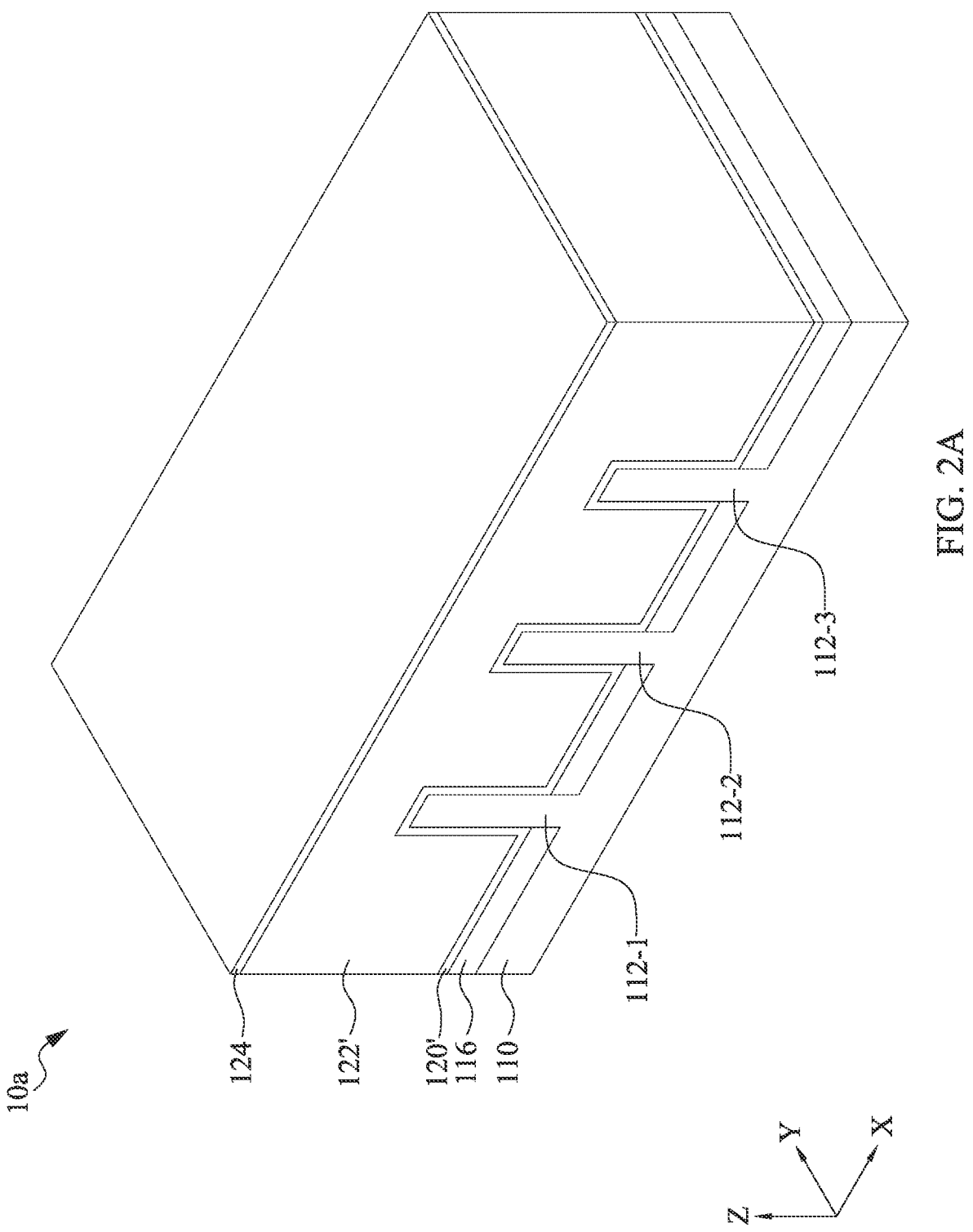
Figure 2B:
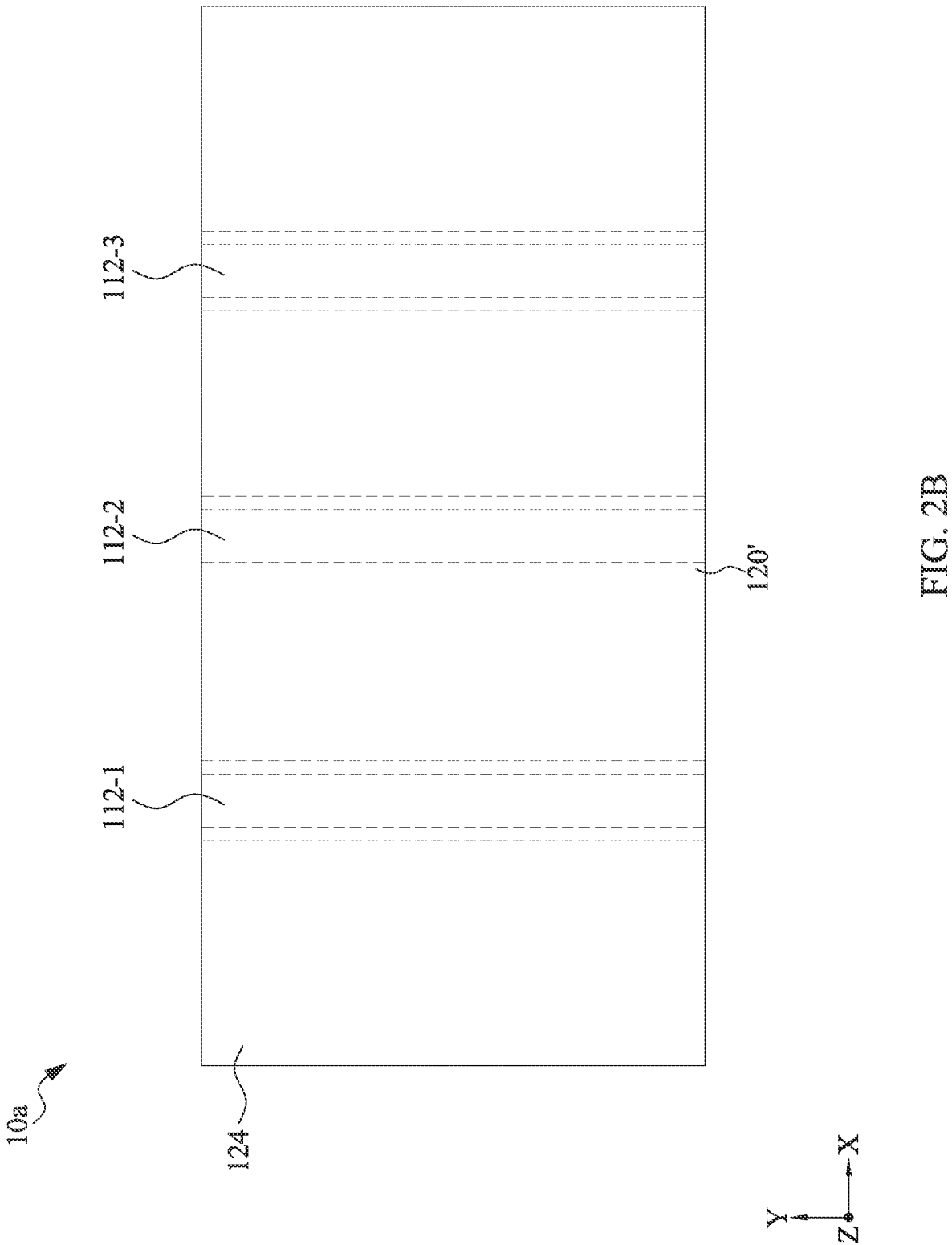

Referring to FIG. 2A and FIG. 2B, a dielectric layer 120', a semiconductor material layer 122', and a mask layer 124 are formed to cover the fins 112-1, 112-2, and 112-3 and the isolation region 116. The dielectric layer 120' is configured to form dummy gate dielectrics in subsequently stages. The dielectric layer 120' includes one or more suitable dielectric materials such as silicon oxide ($SiO_2$), silicon nitride ($Si_3N_4$), silicon oxynitride (SiON), low-k dielectrics such as carbon doped oxides, extremely low-k dielectrics such as porous carbon doped silicon dioxide, a polymer such as polyimide, the like, or a combination thereof. In other embodiments, the dielectric layer 120' includes dielectric materials having a high dielectric constant (k value), for example, greater than 3.9. The materials may include metal oxides such as $HfO_2$, $HfZrO_x$, $HfSiO_x$, $HfTiO_x$, $HfAlO_x$, TiN, the like, or a combination thereof. The dielectric layer 120' is formed by thermal oxidation, CVD, ALD, or other suitable techniques.

The semiconductor material layer 122' is formed on the dielectric layer 120'. The semiconductor material layer 122' is configured to define dummy gate electrodes in subsequent stages. In some embodiments, the semiconductor material layer 122' includes polysilicon or other suitable materials. In some embodiments, the semiconductor material layer 122' is formed by CVD, PVD, or other suitable techniques.

The mask layer 124 is formed on the semiconductor material layer 122'. In some embodiments, the mask layer 124 includes silicon nitride, silicon oxide, silicon carbonitride, or multiple layers thereof.

Figure 3A:
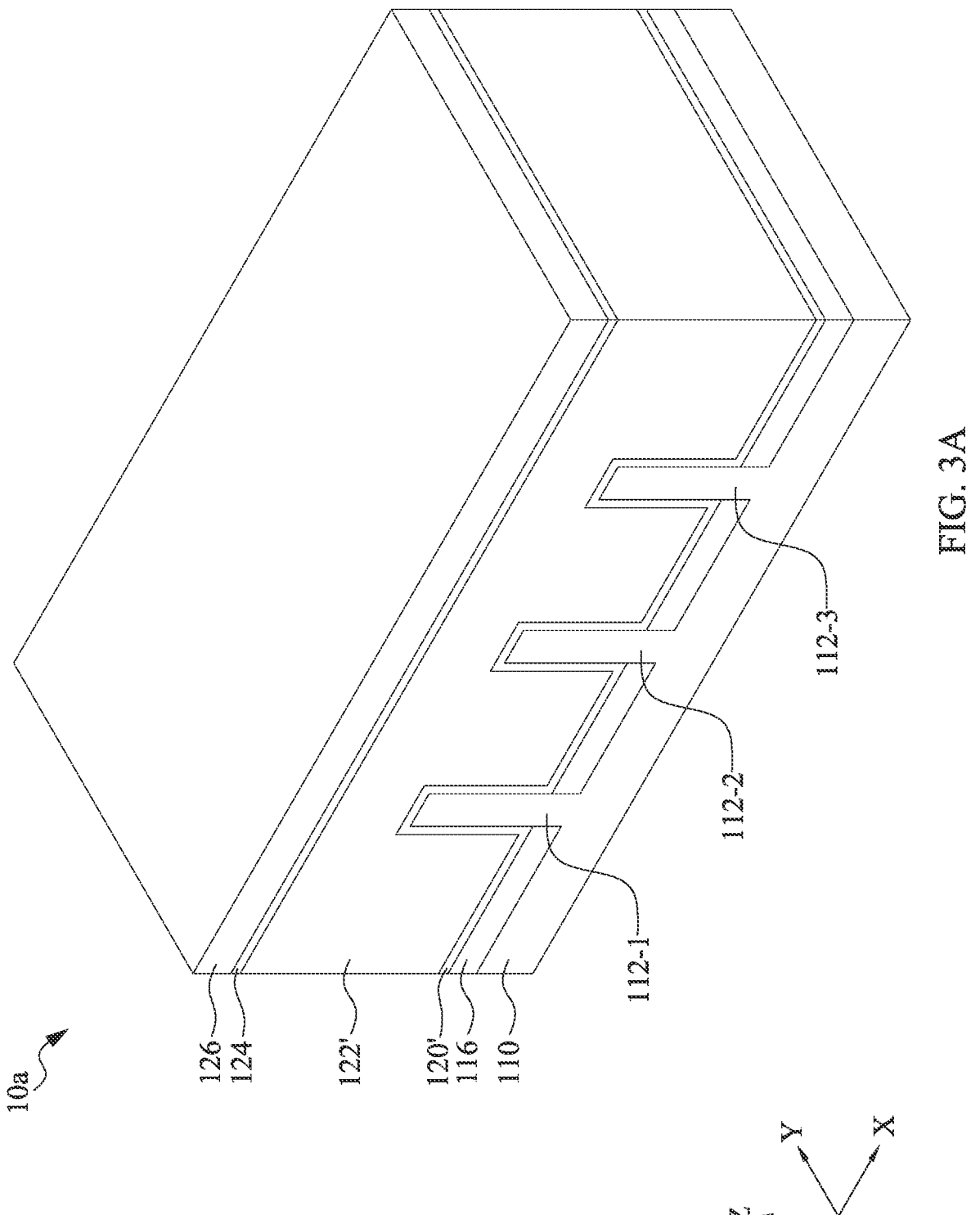
Figure 3B:
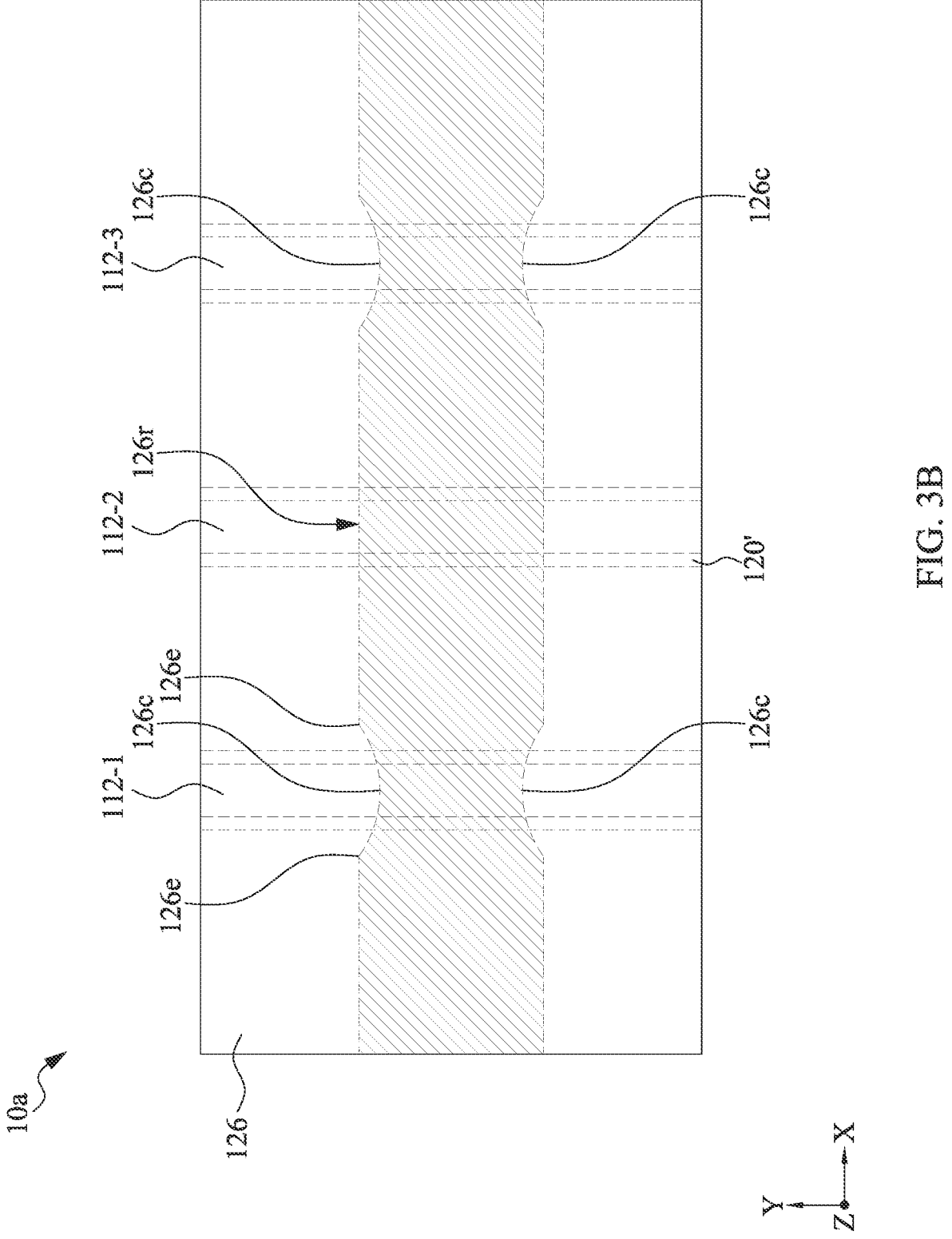

Referring to FIG. 3A and FIG. 3B, a photosensitive material (or photoresist) 126 is formed on the mask layer 124. In some embodiments, the photosensitive material 126 includes a positive-tone or negative-tone photoresist. The photoresist includes a polymeric material, photosensitive composition and a solution according to some embodiments. The dashed region 126r of the photosensitive material 126 indicates a region that defined in a photomask and is developed or undeveloped based on the type of the photosensitive material 126. The photosensitive material or features underlying the dashed region 126r remain after developing. Furthermore, the mask layer 124 in the dashed region 126r remains after an etching technique is performed to transferring the photoresist pattern to the mask layer 124. In some embodiments, the edges of the dashed region 126r have substantially straight lines over the fin 112-2. In some embodiments, the edges of the dashed region 126r have curved profiles 126c recessed inwardly. In some embodiments, the curved profiles 126c are located over the fins 112-1 and 112-3. In some embodiments, the end points 126e of the curved profiles 126c may be located outside of the projection of the fins 112-1 and 112-3. In some embodiments, the profile of the dashed region 126r is tuned or modified by controlling process conditions (e.g., recipes and/or parameters) of photolithography equipment. By modifying the pattern with narrow necks defined on the photomask, the subsequent formed gate structure is modified accordingly, as described below.

Figure 4A:
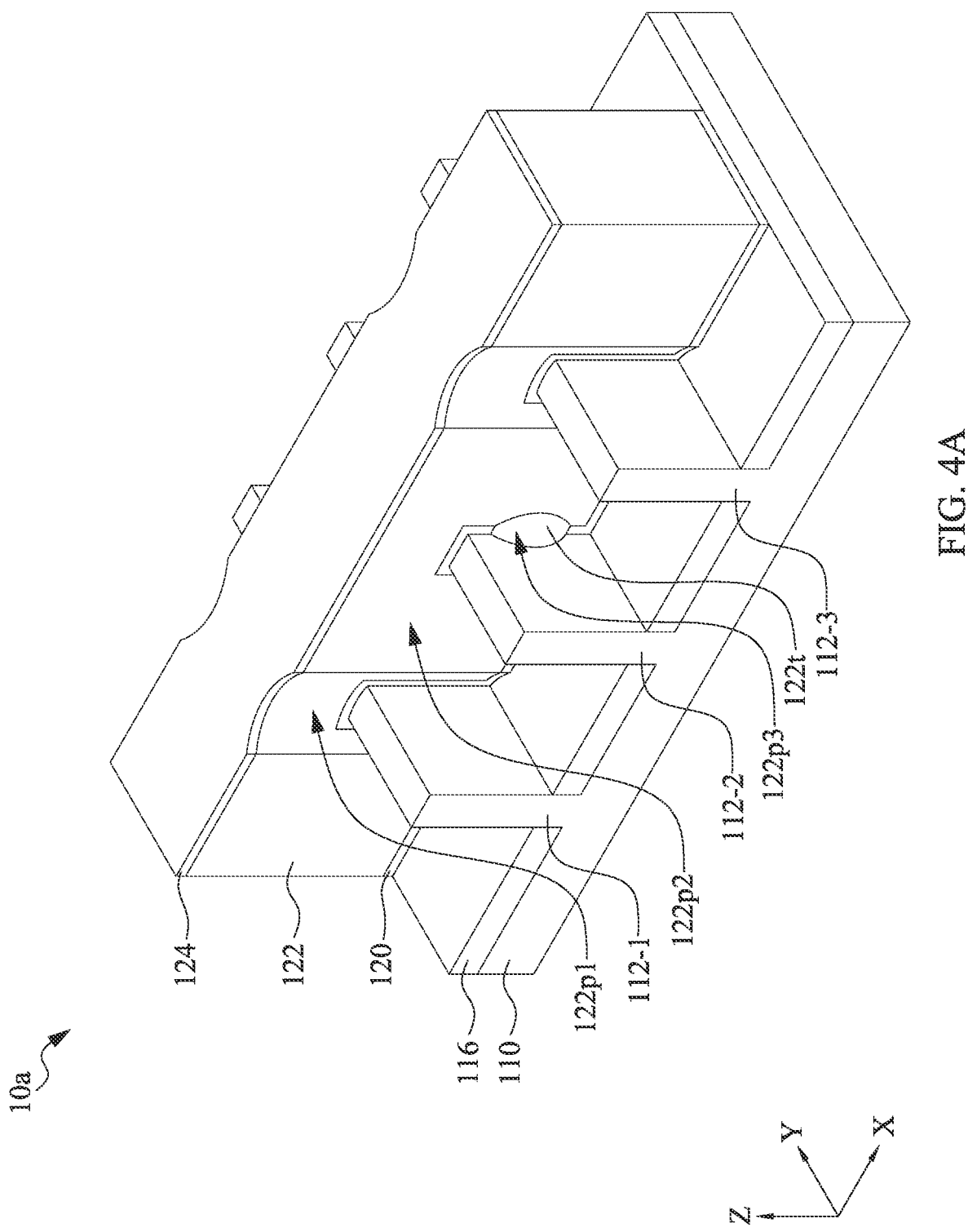
Figure 4B:
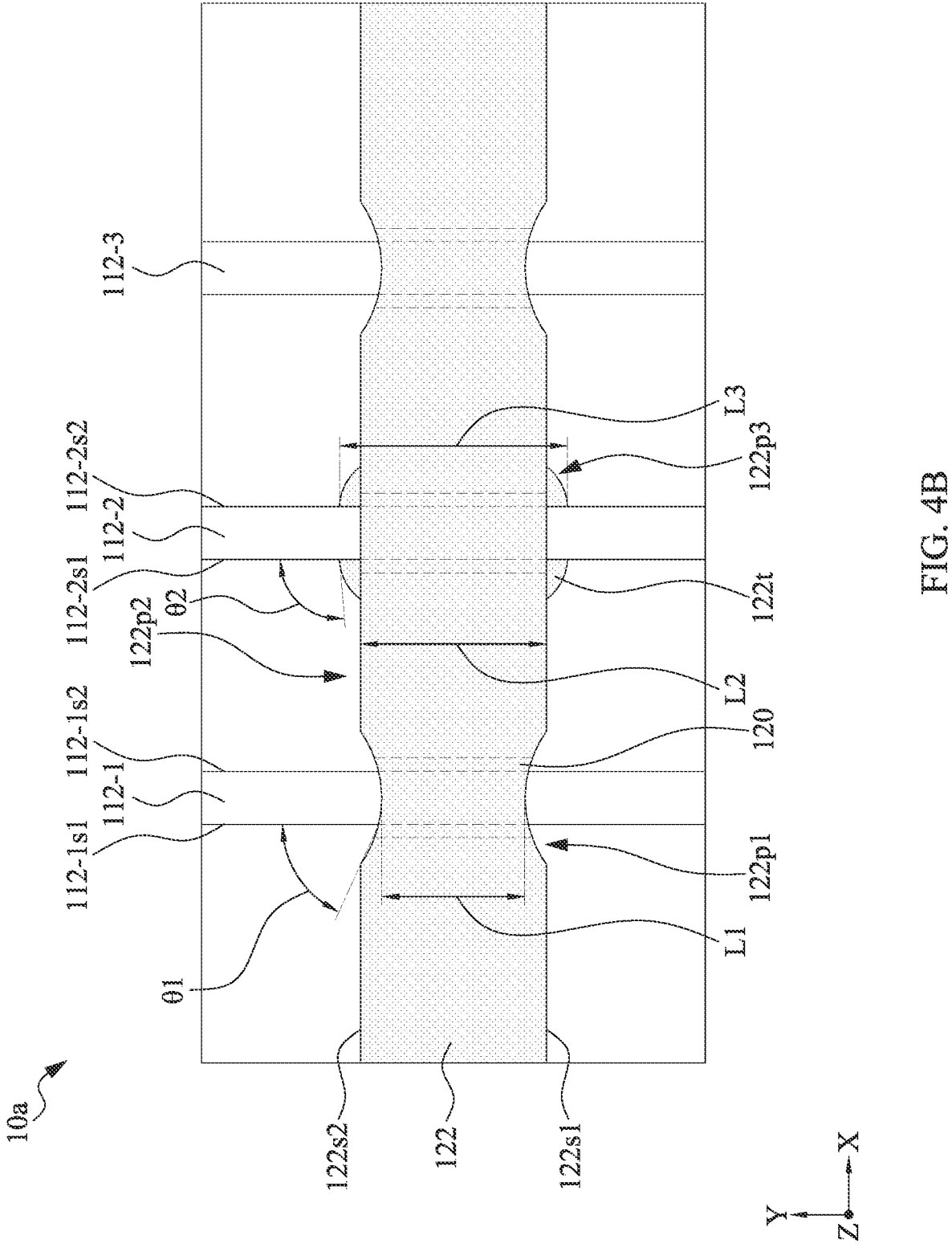

Referring to FIG. 4A and FIG. 4B, an etching technique is performed to pattern the dummy gate materials through the openings of the mask layer 124, and particularly remove a portion of the dielectric layer 120', and semiconductor material layer 122'. As a result, a dummy gate dielectric 120 and a dummy gate electrode 122 are formed over the fins 112-1, 112-2, and 112-3. The dummy gate electrode 122 is disposed on the dummy gate dielectric 120. The dummy gate electrode 122 extends along the X-direction and across the fins 112-1, 112-2, and 112-3. The dummy gate electrode 122 has a sidewall 122s1 and a sidewall 122s2 opposite to the sidewall 122s1. In some embodiments, the sidewall 122s1 and/or 122s2 defines an indentation (or a recess or a notch) over the fin 112-1 and/or 112-3. In some embodiments, the indentation of the sidewall 122s1 and/or 122s2 has a curved profile recessed inwardly. In some embodiments, the dummy gate electrode 122 includes protruding portions 122t adjacent to the sidewall of the intra-fin (e.g., the sidewalls 112-2s1 and 112-2s2 of the fin 112-2). In some embodiments, the protruding portion 122t is formed on the lower portion of the dummy gate electrode 122 so that the upper portion of the dummy gate electrode 122, in a region abutting the intra-fin (e.g., the fin 112-2), has a dimension (e.g., a length along the Y direction) less than a dimension (e.g., a length along the Y direction) of the lower portion. In some embodiments, the protruding portion 122t is in contact with the sidewalls 112-2s1 or 112-2s2 of the fin 112-2. In some alternative embodiments, the dielectric layer 120', and semiconductor material layer 122', and the mask layer 124 are collectively patterned through an etching process using the patterned photoresist as an etch mask.

In some embodiments, the dummy gate electrode 122 has portions 122p1, 122p2, and 122p3. The portion 122p1 corresponds to a region where indentions (or recesses or notches) are formed, and may also be referred to as a narrow portion. The portion 122p3 corresponds to a region where the protruding portions 122t are formed, and may be referred to as a wide portion. The portion 122p2 corresponds to a region where no indentations or protruding portions are formed. For example, the region between the portions 122p1 and 122p3 of the dummy gate electrode 122 can be defined as the portion 122p2. The portion 122p1 has a length L1, which is defined as a distance between sidewalls 122s1 and 122s2 along the Y direction. To be specific, the length L1 may be a minimum distance between sidewalls 122s1 and 122s2 along the Y direction of the portion 122p1. The portion 122p2 has a length L2, which is defined as a distance between sidewalls 122s1 and 122s2 along the Y direction. The portion 122p3 has a length L3, which is defined as a distance between sidewalls 122s1 and 122s2 along the Y direction. To be specific, the length L3 may be a maximum distance between sidewalls 122s1 and 122s2 along the Y direction of the portion 122p1. In some embodiments, the length L3 is greater than the length L2. In some embodiments, the length L2 is greater than the length L1. In furtherance of the embodiments, a ratio L3/L2 is greater than 1.2 or ranging between 1.1 and 1.3; and a ratio L2/L1 is greater than 1.2 or ranging between 1.1 and 1.3.

The dummy gate electrode 122 and the fin 112-1 (or 112-3) define an angle θ1 in a top view. The angle θ1 may be defined as an angle between the sidewall 122s1 (or sidewall 122s2) of the dummy gate electrode 122 and the sidewall 112-1s1 of the fin 112-1 (or the sidewall 112-1s2 of the fin 112-1) that does not overlap the dummy gate electrode 122 along the Z direction. More specifically, angle θ1 denotes the angle formed between the sidewall 112-1s1 and the tangent of the sidewall 122s2 of the portion 122p1, in which the tangent is taken at the intersection point of the sidewall 122s2 and the sidewall 112-1s1, as depicted in FIG. 4B. In some embodiments, the angle θ1 is an acute angle. In some embodiments, the angle θ1 is equal to or greater than about 30° and less than about 90°, such as 30°, 40°, 50°, 60°, 70°, 80°, 85° or 89°. When the angle θ1 is equal to or greater than about 30° and less than about 90°, it means that no bamboo structures, which may cause electrical shorts, are formed at the fin 112-1 (or 112-3).

The dummy gate electrode 122 and the fin 112-2 define an angle θ2 in a top view. The angle θ2 may be defined as an angle between the sidewall 122s1 (or sidewall 122s2) of the dummy gate electrode 122 and the sidewall 112-2s1 (or 112-2s2) of the fin 112-2 that does not overlap the dummy gate electrode 122 along the Z direction. More specifically, angle θ2 denotes the angle formed between the sidewall 112-2s1 and the tangent of the sidewall 122s2 of the portion 122t, in which the tangent is taken at the intersection point of the sidewall 122s2 and the sidewall 112-2s1, as depicted in FIG. 4B. In some embodiments, the angle θ2 is an obtuse angle. In some embodiments, the angle θ2 is greater than about 90° and equal to or less than about 135°, such as 91°, 100°, 110°, 120°, 130°, or 135°. In some embodiments, the angle θ2 is greater than the angle θ1. In some embodiments, the difference between the angles θ1 and θ2 ranges from about 20° to about 70°, such as 20°, 30°, 40°, 50°, 60°, or 70°. Said angles θ1 and θ2 can be measured by state of art metrologies, such as cross-section scanning electron microscopy (SEM), transmission electron microscopy (TEM), critical dimension scanning electron microscopy (CD-SEM).

Although FIG. 4A and FIG. 4B illustrate that the dielectric layer 120' is patterned to form the dummy gate dielectric 120 at this stage, it should be noted that the dielectric layer 120' may be free of being etched at this stage and remain over the isolation region 116. In the embodiments where the dielectric layer 120' is not patterned, said angle θ1 (or θ2) may be defined as an angle between the sidewall of the dummy gate electrode 122 and the sidewall of the dielectric layer 120'.

Figure 5A:
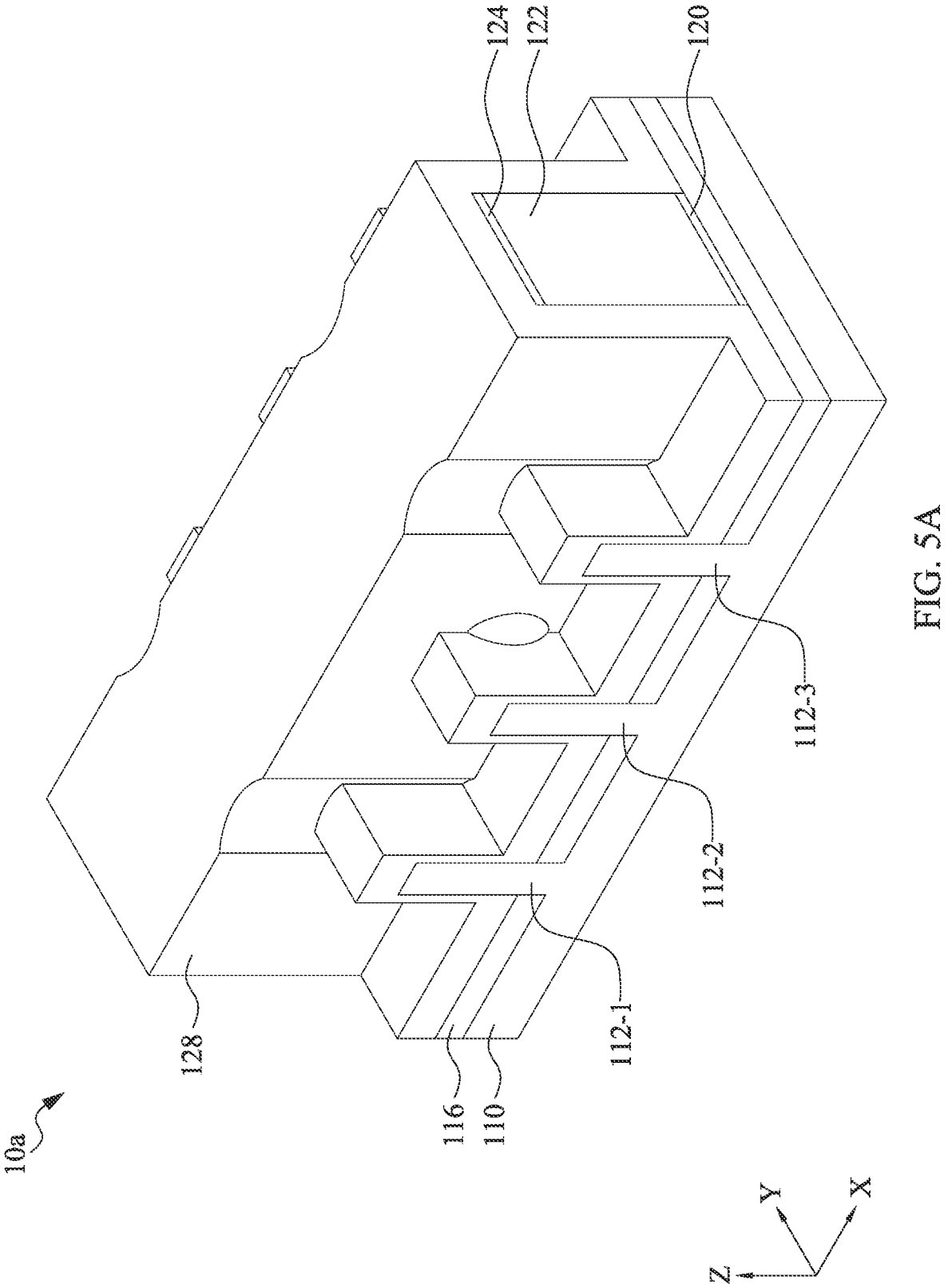
Figure 5B:
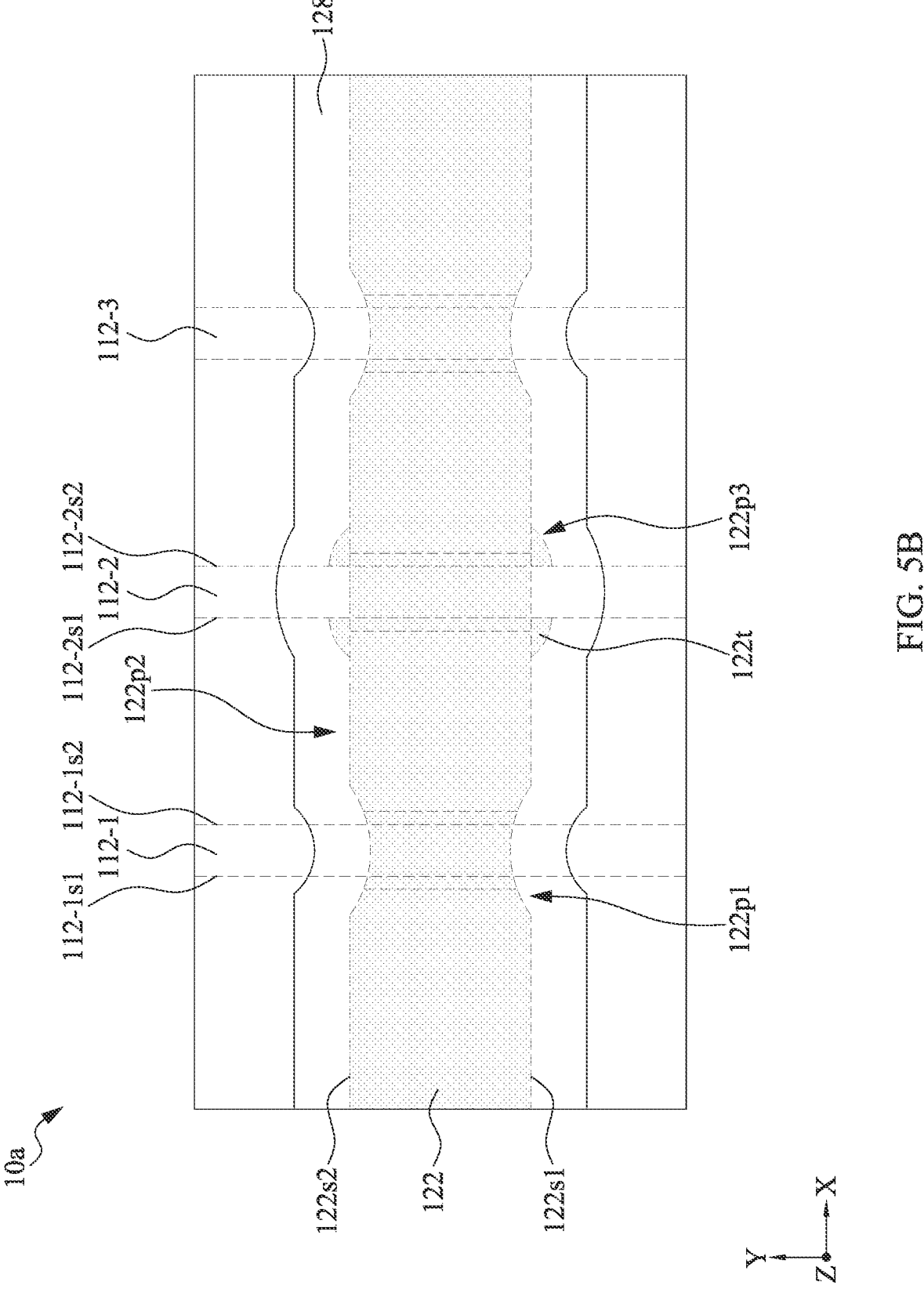

Referring to FIG. 5A and FIG. 5B, a gate spacer 128 is formed to cover the isolation region 116, dummy gate dielectric 120, dummy gate electrode 122, and mask layer 124. The protruding portions 122t are covered by the gate spacer 128. In some embodiments, the gate spacer 128 includes a dielectric material such as silicon nitride, silicon oxide, silicon carbo-nitride, silicon oxynitride, silicon oxy-carbo-nitride, or the like, and may have a single-layer structure or a multi-layer structure including a plurality of dielectric layers.

In some embodiments, the gate spacer 128 is conformally formed on the sidewalls 122s1 and 122s2 of the dummy gate electrode 122. Thus, the sidewall of the gate spacer 128 has a concave profile adjacent to the fins 112-1 and 112-3. In some embodiments, the formation of the gate spacer 128 includes deposition and an anisotropic etching process such as plasma etch. After the anisotropic etching process, the portions of the gate spacer 128 deposited on the mask layer 124 and the substrate 110 (particularly on the isolation region 116 and the S/D regions are removed, such as illustrated in FIG. 6A and FIG. 6B.

Figure 6A:
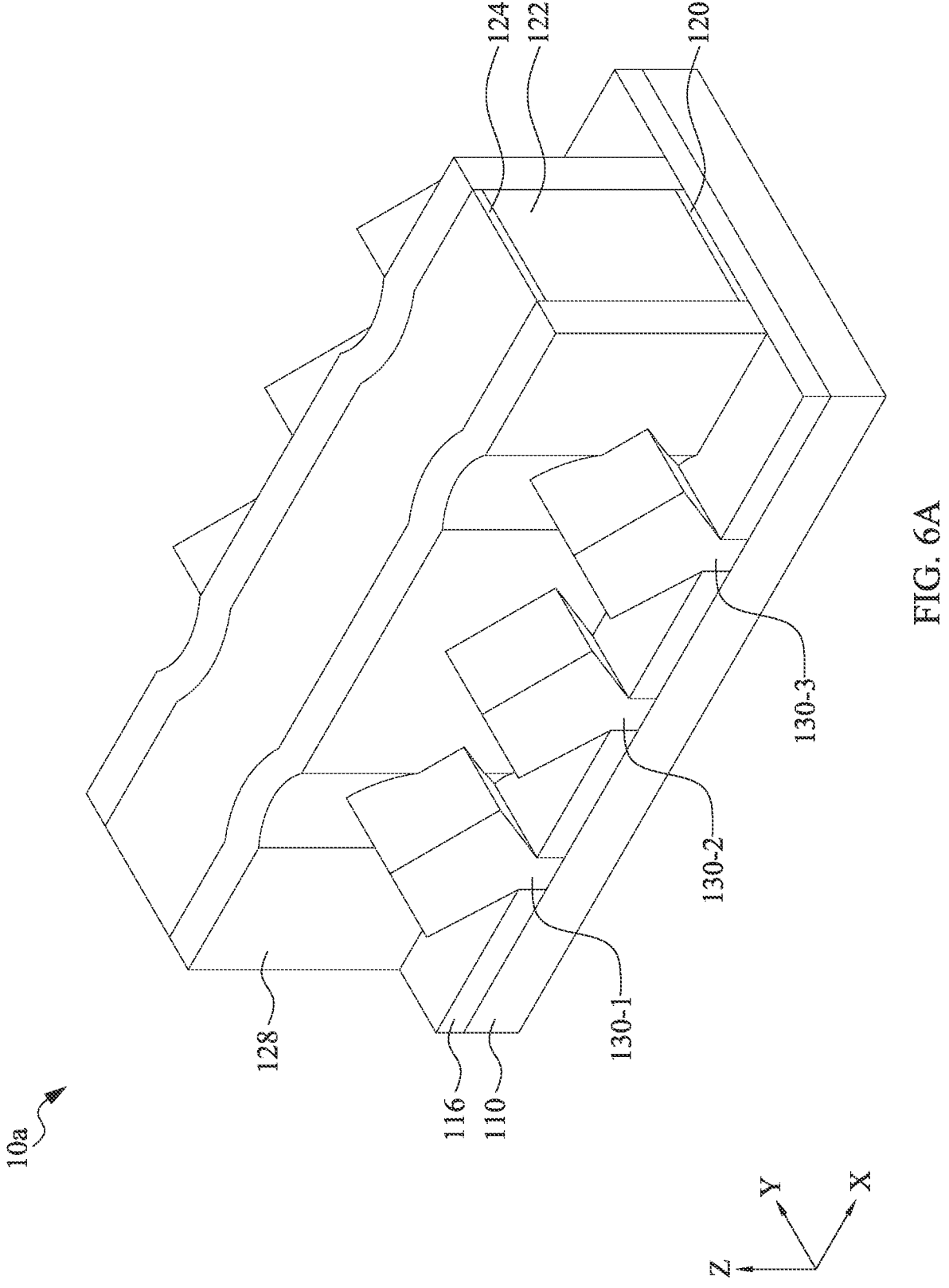
Figure 6B:
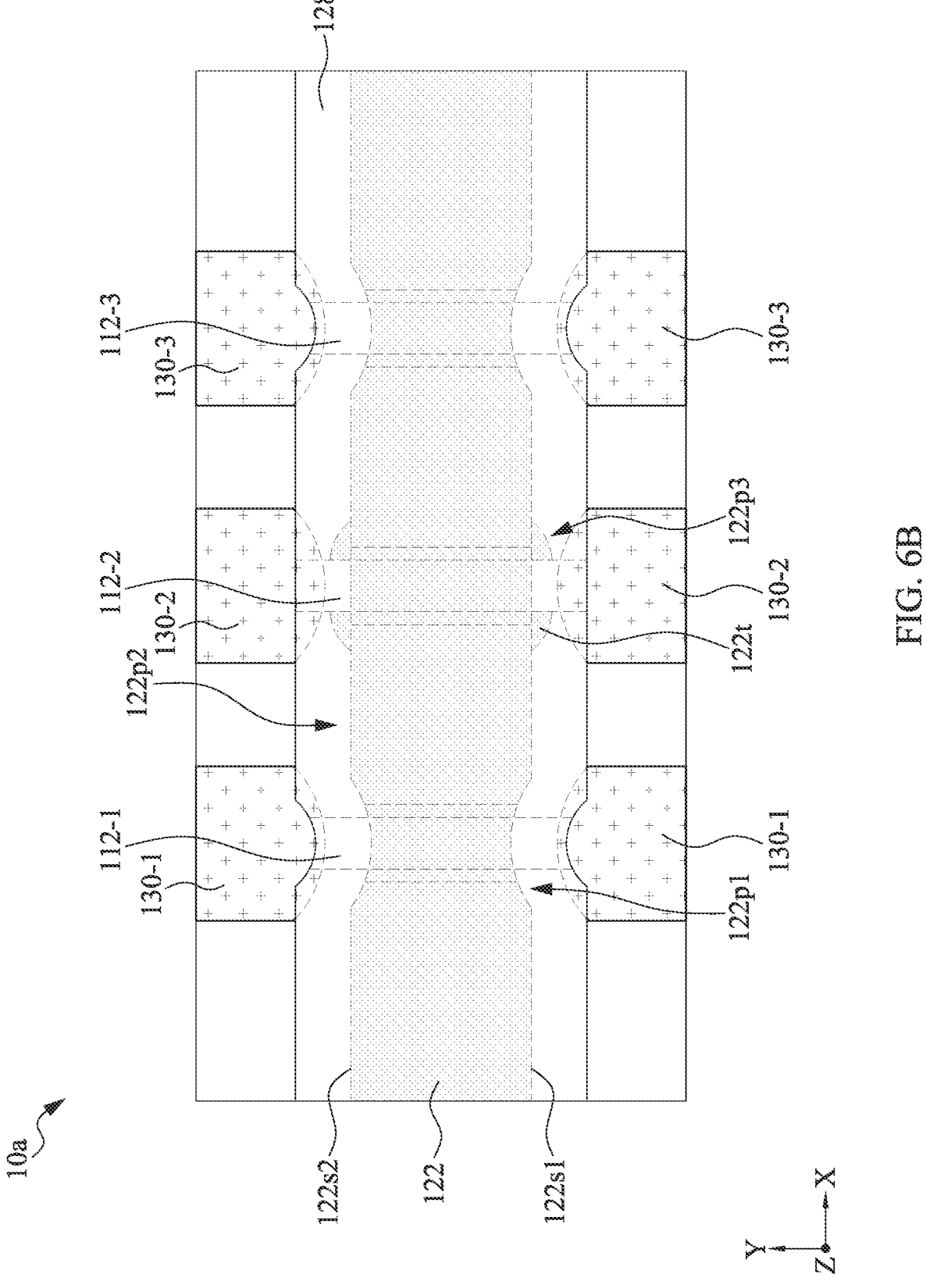

Referring to FIG. 6A and FIG. 6B, source/drain features (S/D features) 130-1, 130-2, and 130-3 are formed on the fins 112-1, 112-2, and 112-3, respectively. In some embodiments, a portion of the gate spacer 128 and a portion of the fins 112-1, 112-2, and 112-3 exposed by the dummy gate electrode 122 are removed to form recesses, and a semiconductor material is formed within the recesses and over the isolation region 116, which results in the structure as shown in FIG. 6A and FIG. 6B. In some embodiments, the S/D features 130-1, 130-2, and 130-3 include silicon germanium, silicon, or silicon carbon. Depending on whether the resulting FinFET is a p-type FinFET or an n-type FinFET, a p-type or an n-type impurity may be in-situ doped. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, the S/D features 130-1, 130-2, and 130-3 are formed of a III-V compound semiconductor such as GaAs, InP, GaN, InGaAs, InAlAs, GaSb, AlSb, AlAs, AlP, GaP, combinations thereof, or multiple layers thereof. After the S/D features 130-1, 130-2, and 130-3 fully fill recesses, the S/D features 130-1, 130-2, and 130-3 start expanding horizontally, and facets may be formed. As shown in FIG. 6B, the S/D feature 130-1, 130-2, and/or 130-3 may have a curved profile which protrudes toward the dummy gate electrode 122 in a top view.

Figure 7A:
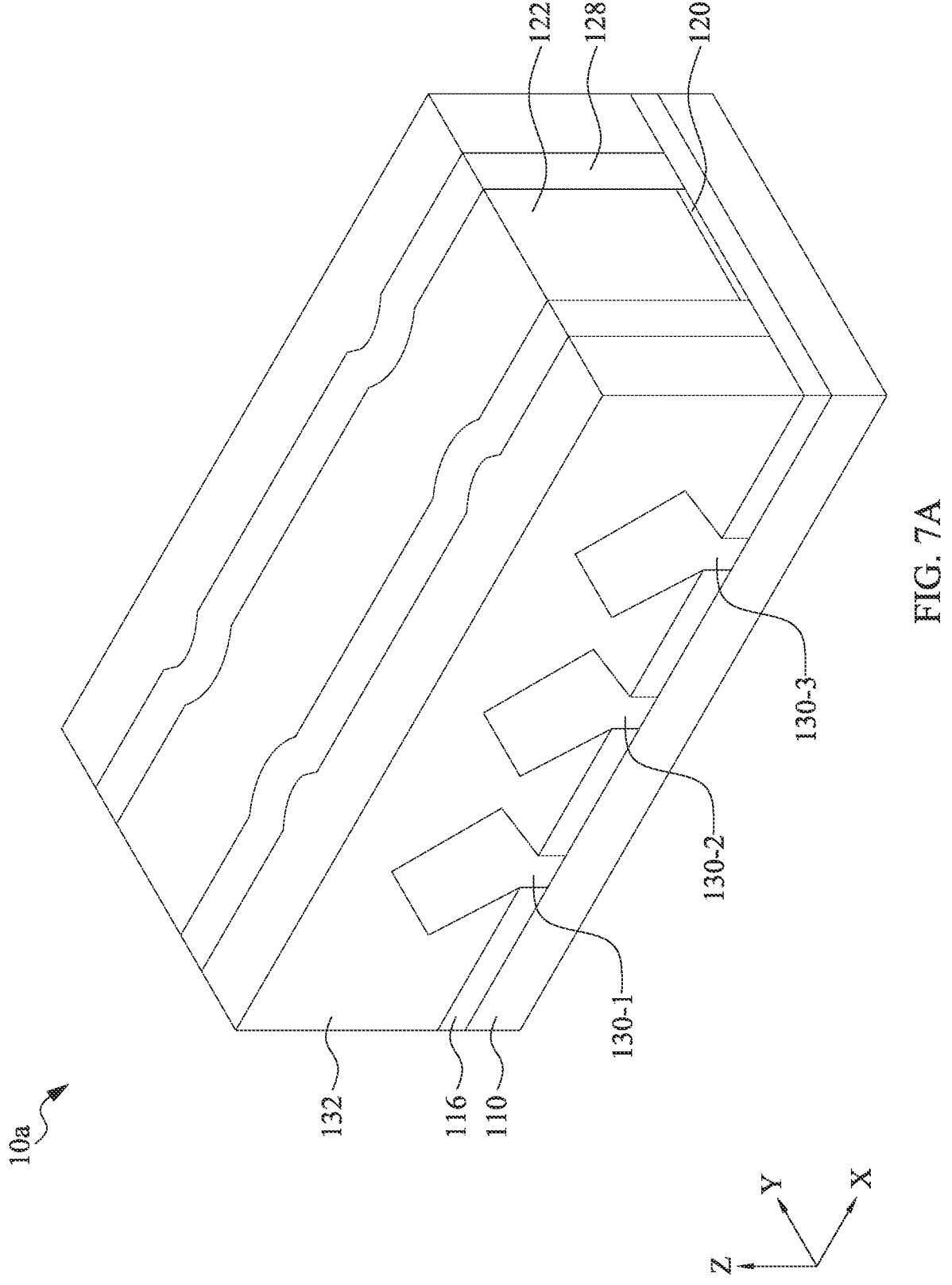
Figure 7B:
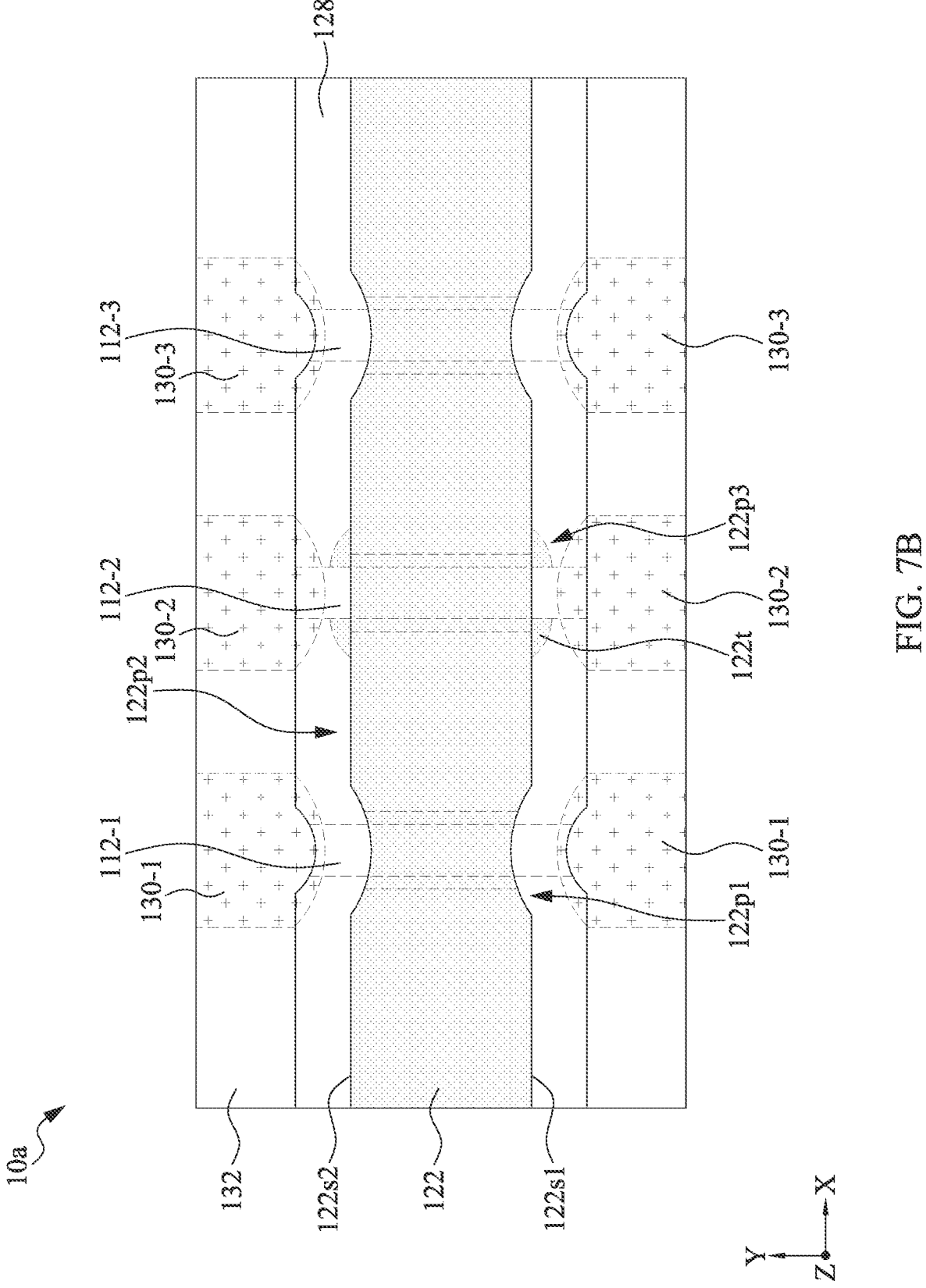

Referring to FIG. 7A and FIG. 7B, a dielectric structure 132 is formed. In some embodiments, the dielectric structure 132 includes a multi-layered structure. For example, the dielectric structure 132 may include a contact etch stop layer (CESL), an inter-layer dielectric (ILD), and other suitable layers. The CESL may include or be made of silicon nitride, silicon carbo-nitride, or the like, and may be formed using a conformal deposition technique, such as ALD or CVD. The ILD may include a dielectric material formed using, for example, FCVD, spin-on coating, CVD, or another deposition technique. The ILD may also be formed of an oxygen-containing dielectric material, which may include silicon-oxide based such as tetra ethyl ortho silicate (TEOS) oxide, plasma-enhanced CVD (PECVD) oxide ($SiO_2$), phospho-silicate glass (PSG), boron-silicate glass (BSG), boron-doped phospho-silicate glass (BPSG), or other suitable materials. A planarization technique (such as chemical mechanical polish (CMP) or mechanical grinding) is performed to planarize the top surface and remove a portion of the dielectric structure 132, the mask layer 124, and the dummy gate electrode 122. As a result, the upper surface of the dummy gate electrode 122 is level with the upper surface of the dielectric structure 132.

Figure 8A:
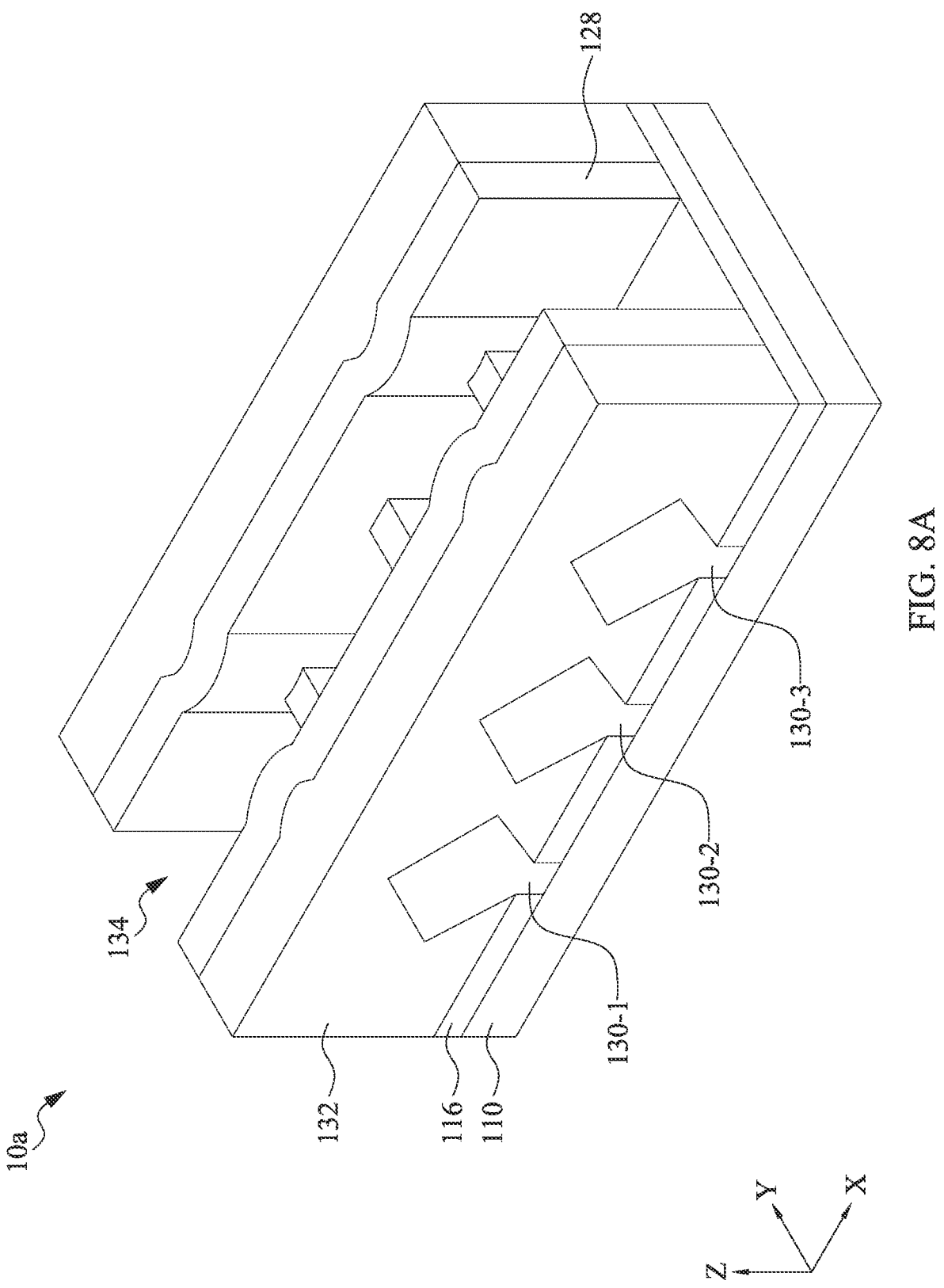
Figure 8B:
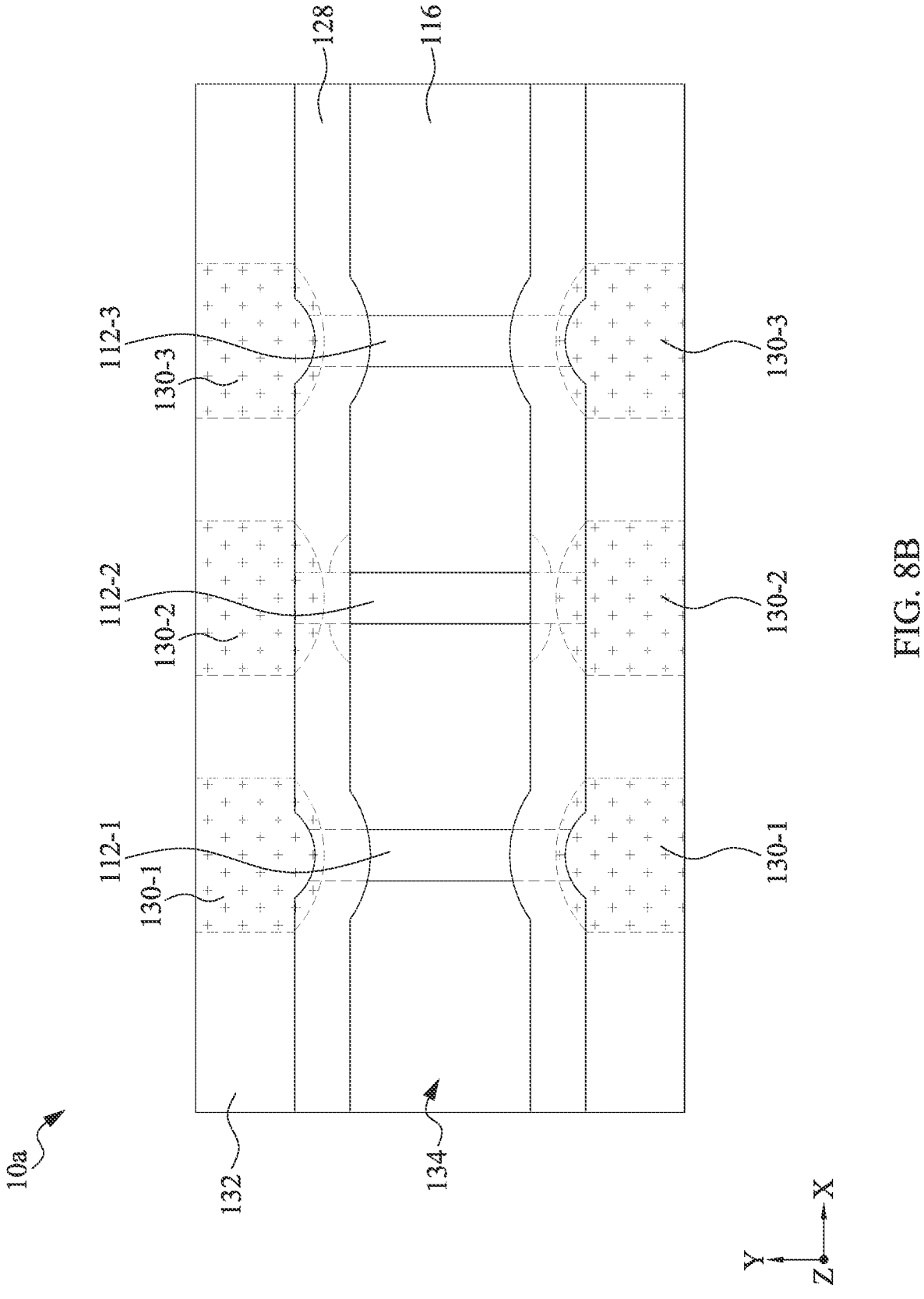

Referring to FIG. 8A and FIG. 8B, a removal technique (e.g., an etching technique) is performed to remove the dummy gate dielectric 120 and the dummy gate electrode 122, including the protruding portions 122t, to form an opening 134.

In some embodiments, the removal of the dummy gate dielectric 120 and the dummy gate electrode 122 includes two or more etching steps, each targeting specific material compositions. For example, a first etching step may have high etching selectivity tuned to the dummy gate electrode 122 with substantially no (or minimum) etching loss occurring to the gate spacer 128 or the dummy gate dielectric 120. In some embodiments, the first etching step may be an anisotropic etching process using process gases selected from, though not limited to, $Cl_2$, $BCl_3$, Ar, $CH_4$, $CF_4$, and combinations thereof.

A second etching step may have high etching selectivity tuned to dummy gate dielectric 120 with substantially no (or minimum) etching loss occurring to gate spacer 128 or the fins 112-1, 112-2, and 112-3. In accordance with some embodiments of the present disclosure, the second etching step may be a dry etching process, a wet etching process, or other suitable etching process. In some embodiments, the second etching step uses a chemical solution, which includes diluted HF.

Although FIG. 8A and FIG. 8B illustrates that the dummy gate dielectric 120 is completely removed at this stage, the dummy gate dielectric 120 can be optionally removed after the removal of the dummy gate electrode 122. For example, the dummy gate dielectric 120 is removed from a first region (e.g., a core logic region) and remains in a second region (e.g., an input/output region).

As shown in FIG. 8B, the opening 134 inherits the profile of the dummy gate electrode 122. For example, the opening 134 defines indentations (or recesses or notches) adjacent to the fins 112-1 and 112-3. The opening 134 defines protruding portions adjacent to the lower portion of the fin 112-2.

The protruding portion 122t of the dummy gate electrode 122 may also be referred to as a bamboo structure, which is formed under some process conditions. In a comparative example, the bamboo structures are formed not only on the intra-fin but also on the outer fin. In some cases where the bamboo structures are formed at the outer fin, over etching during removal of the dummy gate electrode occurs to the outer fin due to a loading effect, leading to exposed or damaged S/D features. In this condition, an electrical short may occur between the exposed S/D feature and a subsequently formed gate electrode. In the embodiments of present disclosure, the profile of the dummy gate electrode 122 is tuned or modified, and the dummy gate electrode 122 defines indentions (or recesses or notches) at the outer fins (e.g., the fin 112-1 and/or 112-3), which prevents bamboo structures from forming at the outer fins. Since there are no bamboo structures formed adjacent to the outer fins, an over etching occurring to the outer fins, caused by a loading effect, can be avoided. As a result, the S/D features 130-1 and/or 130-3 can be free of damage or from being exposed after this stage.

Figure 9A:
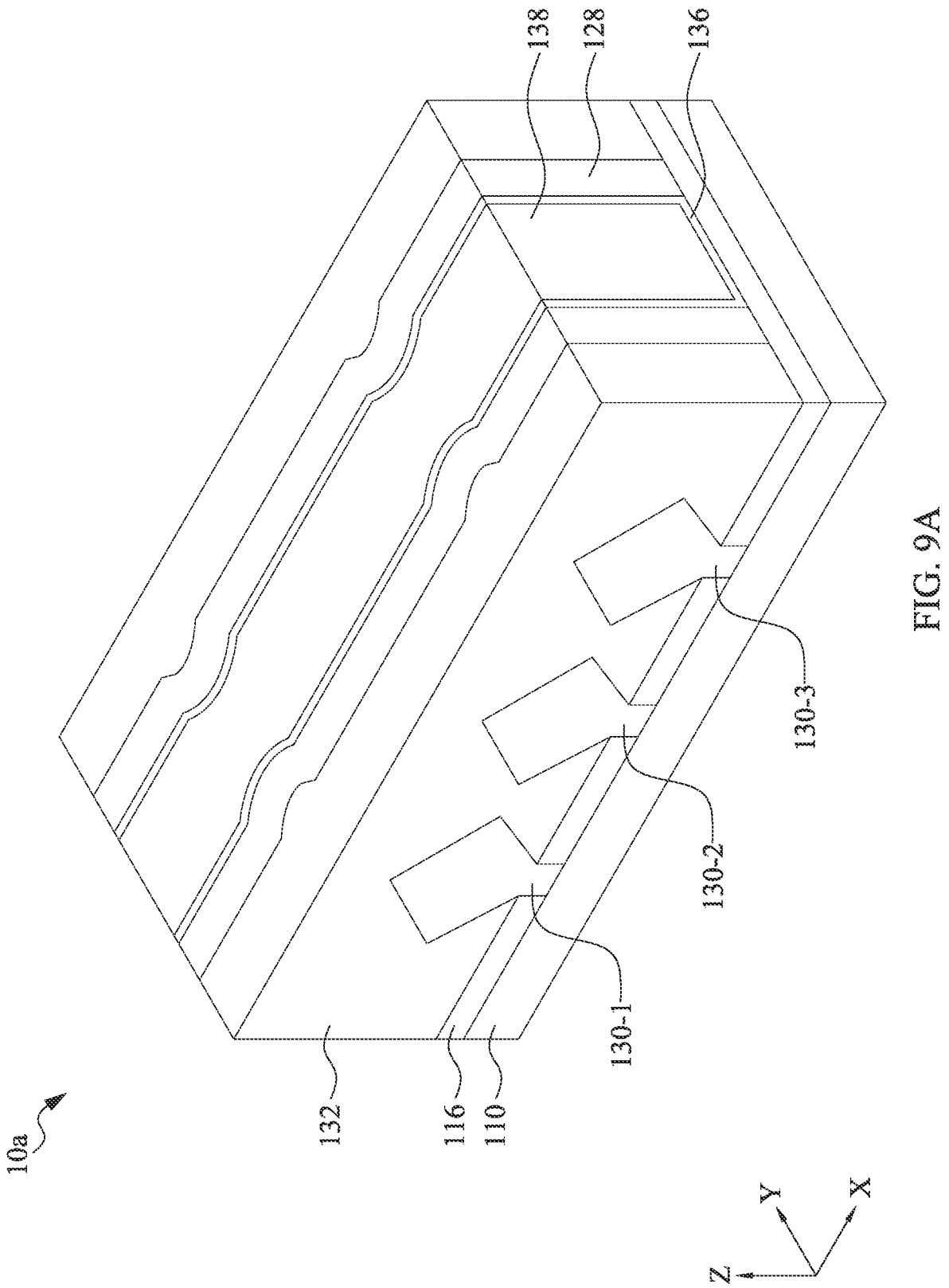
Figure 9B:
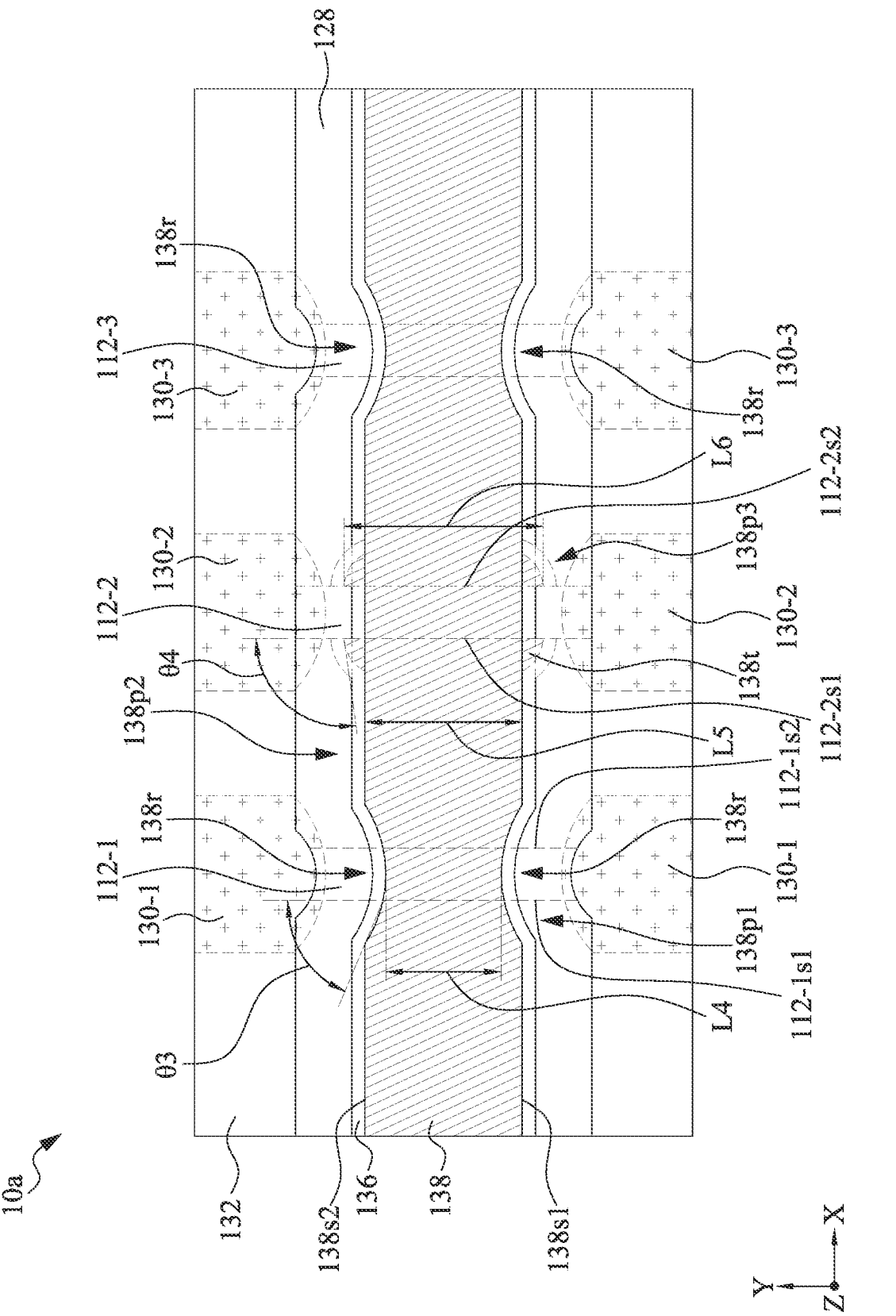

Referring to FIG. 9A and FIG. 9B, a gate dielectric 136 and a gate electrode 138 are formed within the opening 134. The gate dielectric 136 is deposited conformally in the opening 134, such as on the upper surfaces and the sidewalls (e.g., 112-1s1, 112-1s2, 112-2s1, and 112-2s2) of the fins 112-1, 112-2, and 112-3 as well as on the sidewalls of the gate spacer 128. In some embodiments, the gate dielectric 136 includes silicon oxide, silicon nitride, or multilayers thereof. In some embodiments, the gate dielectric 136 includes a high-k dielectric material, and in these embodiments, the gate dielectric 136 may have a k value greater than about 7.0, and may include a metal oxide or a silicate of hafnium, aluminum, zirconium, lanthanum, manganese, barium, titanium, lead, and combinations thereof. The formation methods of the gate dielectric 136 may include molecular-beam deposition (MBD), ALD, PECVD, and the like.

In some embodiments, the gate dielectric 136 is conformally formed within the opening 134. Thus, the sidewall of the gate dielectric 136 has a concave profile adjacent to the fins 112-1 and 112-3 in a top view.

The gate electrode 138 is disposed on the gate dielectric 136 and fills the remaining portion of the opening 134. The gate electrode 138 may include a metal-containing material such as titanium nitride, titanium oxide, tantalum nitride, tantalum carbide, cobalt, ruthenium, aluminum, tungsten, combinations thereof, or multiple layers thereof. Although a single layer gate electrode 138 is illustrated in FIG. 9A and FIG. 9B, the gate electrode 138 may include any number of liners, any number of work function tuning layers, and other suitable fillers. After the filling of the opening 134, a planarization technique, such as a CMP, may be performed to remove the excess portions of the gate dielectric 136 and the material of the gate electrode 138. The gate electrode 138 and the gate dielectric 136 may be collectively referred to as a "gate stack."

As shown in FIG. 9B, the gate electrode 138 extends along the X-direction and across the fins 112-1, 112-2, and 112-3. The gate electrode 138 has a sidewall 138s1 and a sidewall 138s2 opposite to the sidewall 138s1. In some embodiments, the gate electrode 138 inherits at least a portion of the profile of the dummy gate electrode 122. For example, the sidewall 138s1 and/or 138s2 defines an indentation 138r (or a recess or a notch) over the fin 112-1 and/or 112-3. In some embodiments, the indentation 138r (or a recess or a notch) includes a curved profile recessed inwardly over the fin 112-1 and/or 112-3. In some embodiments, the gate electrode 138 includes protruding portions 138t adjacent to the sidewalls 112-2s1 and 112-2s2 of the fin 112-2. In some embodiments, the protruding portion 138t is in contact with the sidewalls 112-2s1 and 112-2s2 of the fin 112-2.

In some embodiments, the gate electrode 138 has portions 138p1, 138p2, and 138p3. The portion 138p1 corresponds to a region where the indentions 138r (or recesses or notches) are formed, and may also be referred to as a narrow portion. The portion 138p3 corresponds to a region where the protruding portions 138t are formed, and may also be referred to as a wide portion. The portion 138p2 corresponds to a region where no indentations or protruding portions are formed. For example, the region between the portion 138p1 and portion 138p3 of the gate electrode 138 can be defined as the portion 138p2. The portion 138p1 has a length L4, which is defined as a distance between sidewalls 138s1 and 138s2 along the Y direction. The portion 138p2 has a length L5, which is defined as a distance between sidewalls 138s1 and 138s2 along the Y direction. The portion 138p3 has a length L6, which is defined as a distance between sidewalls 138s1 and 138s2 along the Y direction. In some embodiments, the length L6 is greater than the length L5. In some embodiments, the length L5 is greater than the length L4.

The gate electrode 138 and the fin 112-1 (or 112-3) define an angle θ3 in a top view. The angle θ3 may be defined as an angle between the sidewall 138s1 (or sidewall 138s2) of the gate electrode 138 and the sidewall 112-1s1 (or 112-1s2) of the fin 112-1 that does not overlap the gate electrode 138 along the Z direction. More specifically, angle θ3 denotes the angle formed between the sidewall 112-1s1 of the fin 112-1 and the tangent of the sidewall 138s2 of the gate electrode 138, in which the tangent is taken at the intersection point of the sidewall 138s2 and the sidewall 112-1s1, as depicted in FIG. 9B. In some embodiments, the angle θ3 is an acute angle. In some embodiments, the angle θ3 is equal to or greater than about 30° and less than about 90°, such as 30°, 40°, 50°, 60°, 70°, 80°, 85° or 89°. When the angle θ3 is equal to or greater than about 30° and less than about 90°, it means that no bamboo structures, which may cause electrical shorts, are formed at the fin 112-1 (or 112-3).

The gate electrode 138 and the fin 112-2 define an angle θ4 in a top view. The angle θ4 may be defined as an angle between the sidewall 138s1 (or sidewall 138s2) of the gate electrode 138 and the sidewall 112-2s1 of the fin 112-2 that does not overlap the gate electrode 138 along the Z direction. More specifically, angle θ4 denotes the angle formed between the sidewall 112-2s1 of the fin 112-2 and the tangent of the sidewall 138s2 of the portion 138t, in which the tangent is taken at the intersection point of the sidewall 138s2 and the sidewall 112-2s1, as depicted in FIG. 9B. In some embodiments, the angle θ4 is an obtuse angle. In some embodiments, the angle θ4 is greater than about 90° and equal to or less than about 135°, such as 91°, 100°, 110°, 120°, 130°, or 135°. In some embodiments, the angle θ4 is greater than the angle θ3. In some embodiments, the difference between the angles θ3 and θ4 ranges from about 20° to about 70°, such as 20°, 30°, 40°, 50°, 60°, or 70°. Said angles θ3 and θ4 can be measured by state of art metrologies, such as SEM, TEM, or CD-SEM.

Similarly, the gate dielectric 136 and the fins 112-1, 112-2, and 112-3 may define angles the same as or similar to the angles θ3 and θ4. Further, the gate dielectric 136 defines indentions adjacent to the fins 112-1 and 112-3.

As mentioned above, the bamboo structures are not formed adjacent to the outer fins (e.g., the fin 112-1 and/or 112-3). As a result, the S/D features 130-1 and 130-3 may be free from being exposed or damaged, caused by over etching, after removal of the dummy gate electrode 122. Therefore, an electrical short between the gate electrode and S/D features can be avoided.

Figure 10:
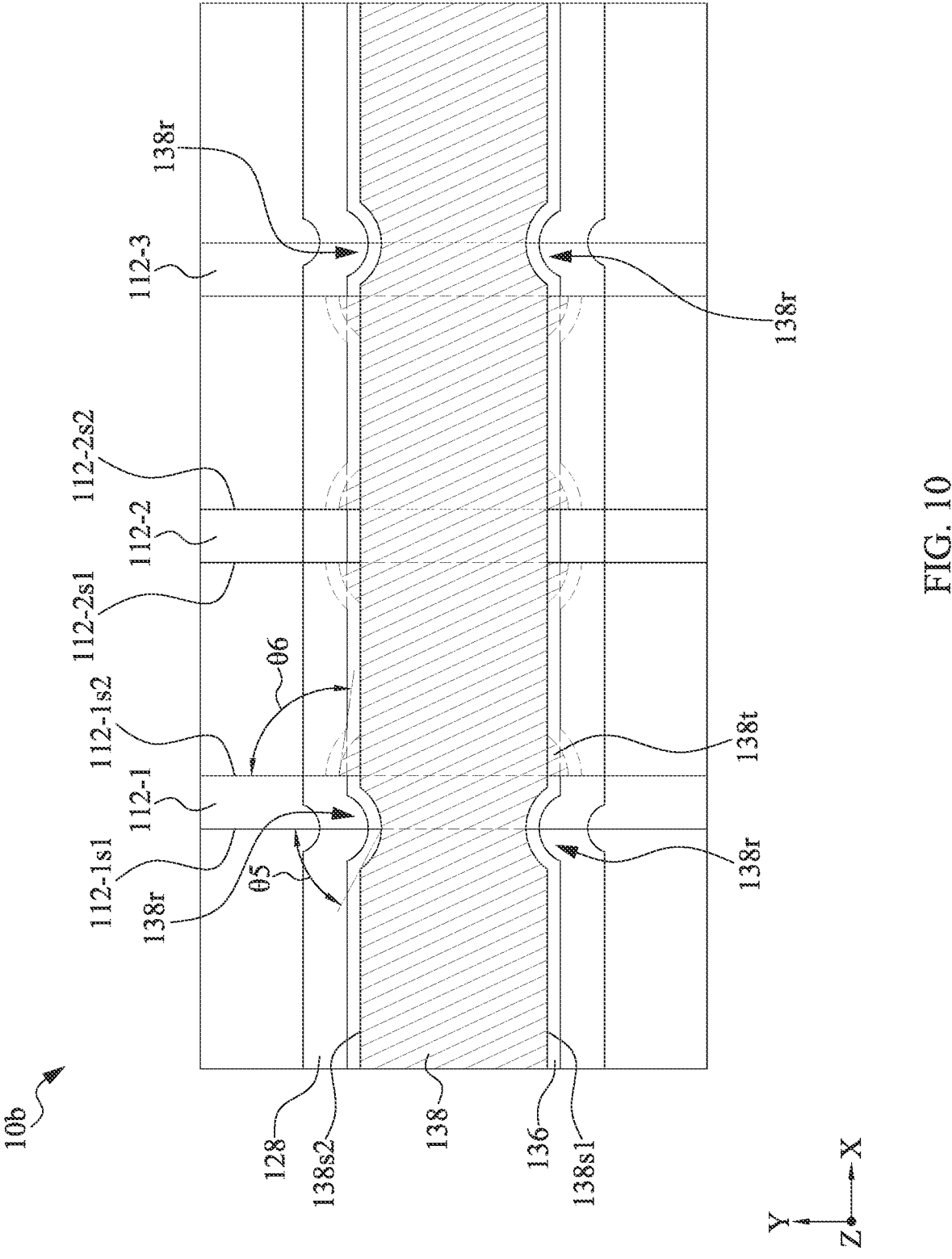
FIG. 10 is a top view of a semiconductor device, in accordance with some embodiments of the present disclosure.

FIG. 10 is a top view of a semiconductor device 10b, in accordance with some embodiments of the present disclosure. The semiconductor device 10b has a structure similar to that of the semiconductor device 10a, with differences therebetween as follow.

An angle θ5 denotes the angle formed between the sidewall 112-1s1 of the fin 112-1 and the tangent of the sidewall 138s2 of the portion 138r, in which the tangent is taken at the intersection point of the sidewall 138s2 and the sidewall 112-1s1, as depicted in FIG. 10. An angle θ6 denotes the angle formed between the sidewall 112-1s2 of the fin 112-1 and the tangent of the sidewall 138s2 of the portion 138t, in which the tangent is taken at the intersection point of 138s2 and 112-1s2, as depicted in FIG. 10. In some embodiments, the angle θ5 is different from the angle θ6. In some embodiments, the angle θ5 is equal to or greater than about 30° and less than about 90°, such as 30°, 40°, 50°, 60°, 70°, 80°, 85° or 89°. In some embodiments, the angle θ6 is greater than about 90° and equal to or less than about 135°, such as 91°, 100°, 110°, 120°, 130°, or 135°. In some embodiments, the angle θ6 is greater than the angle θ5. In some embodiments, the difference between the angles θ5 and θ6 ranges from about 20° to about 70°, such as 20°, 30°, 40°, 50°, 60°, or 70°.

Similarly, the gate dielectric 136 and the fins 112-1, 112-2, and 112-3 may define angles the same as or similar to the angles θ5 and θ6.

Over etching generally occurs to the outer side (e.g., the sidewall 112-1s1) of the outer fin (e.g., the fin 112-1) in some process conditions, and the profile of the dummy gate may be modified so that the protruding portions (e.g., bamboo structures) of the dummy gate can be formed at the sidewall 112-1s2 and the indentions of the dummy gate may be formed over the sidewall 112-1s1. In this embodiment, the gate electrode 138 can inherit the profile of the dummy gate so that the gate electrode 138 has a structure as shown in FIG. 10.

Figure 11:
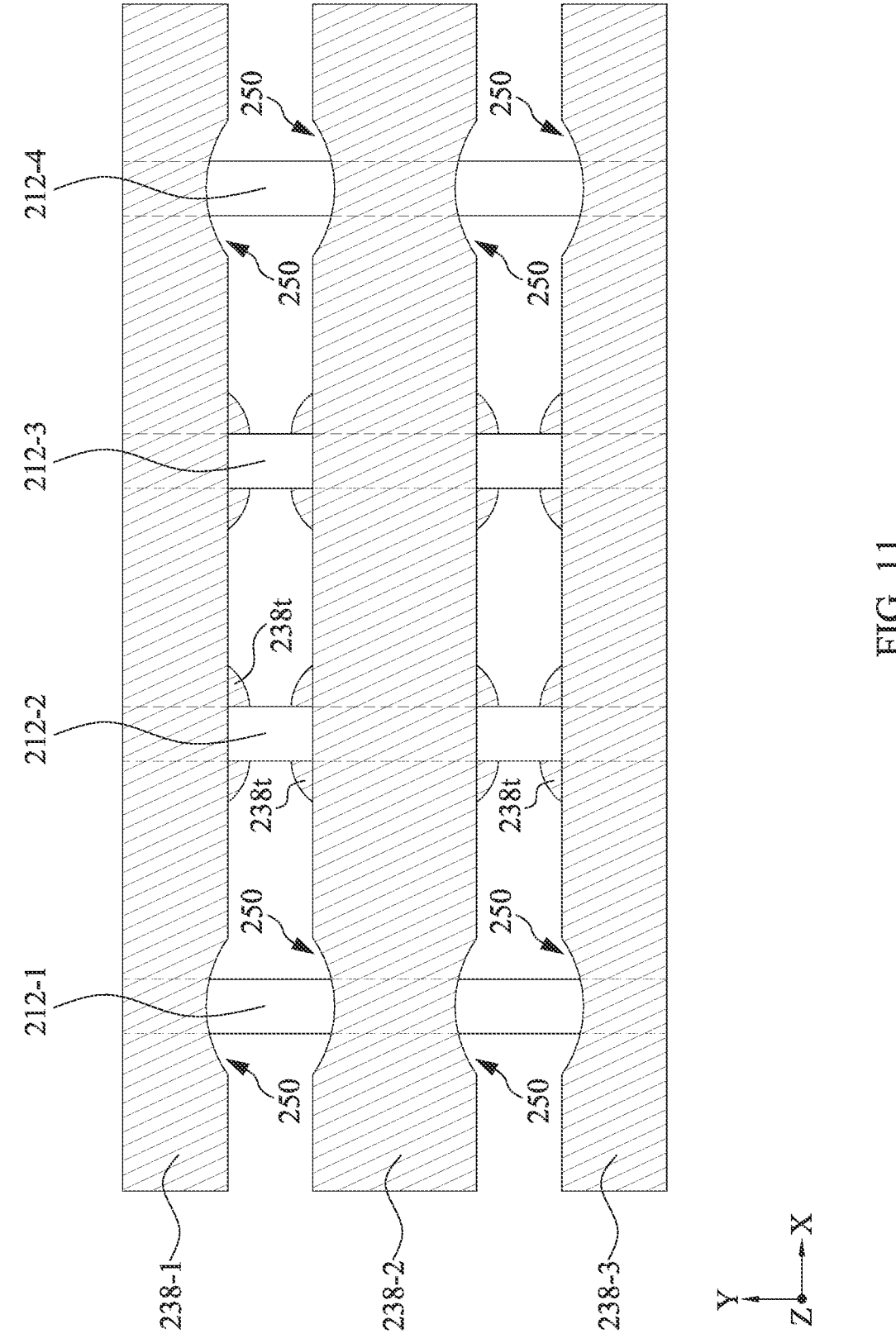
FIG. 11 is a top view of a semiconductor device, in accordance with some embodiments of the present disclosure.

FIG. 11 is a top view of a semiconductor device 20, in accordance with some embodiments of the present disclosure. It should be noted that some features (e.g., the gate dielectric and gate spacer) are omitted from FIG. 11 for brevity.

The semiconductor device 20 includes fins 212-1, 212-2, 212-3, and 212-4, each of which extends along the Y direction. The fins 212-1, 212-2, 212-3, and 212-4 may define or constitute a fin group. The fins 212-1 and 212-4 are outer fins of the fin group. The fins 212-2 and 212-3 are intra-fins of the fin group. The semiconductor device 20 includes gate electrodes 238-1, 238-2, and 238-3, each of which extends along the X direction and across the fins 212-1 to 212-4. In some embodiments, the sidewall of the gate electrode 238-1 (or 238-2 or 238-3) defines indentions 250 (or recesses or notches) overlapping the fin 212-1 (or 212-4) along the Z direction. Each of the gate electrodes 238-1 to 238-3 includes protruding portions 238t over the sidewalls of the fins 212-2 and 212-3.

Figure 12:
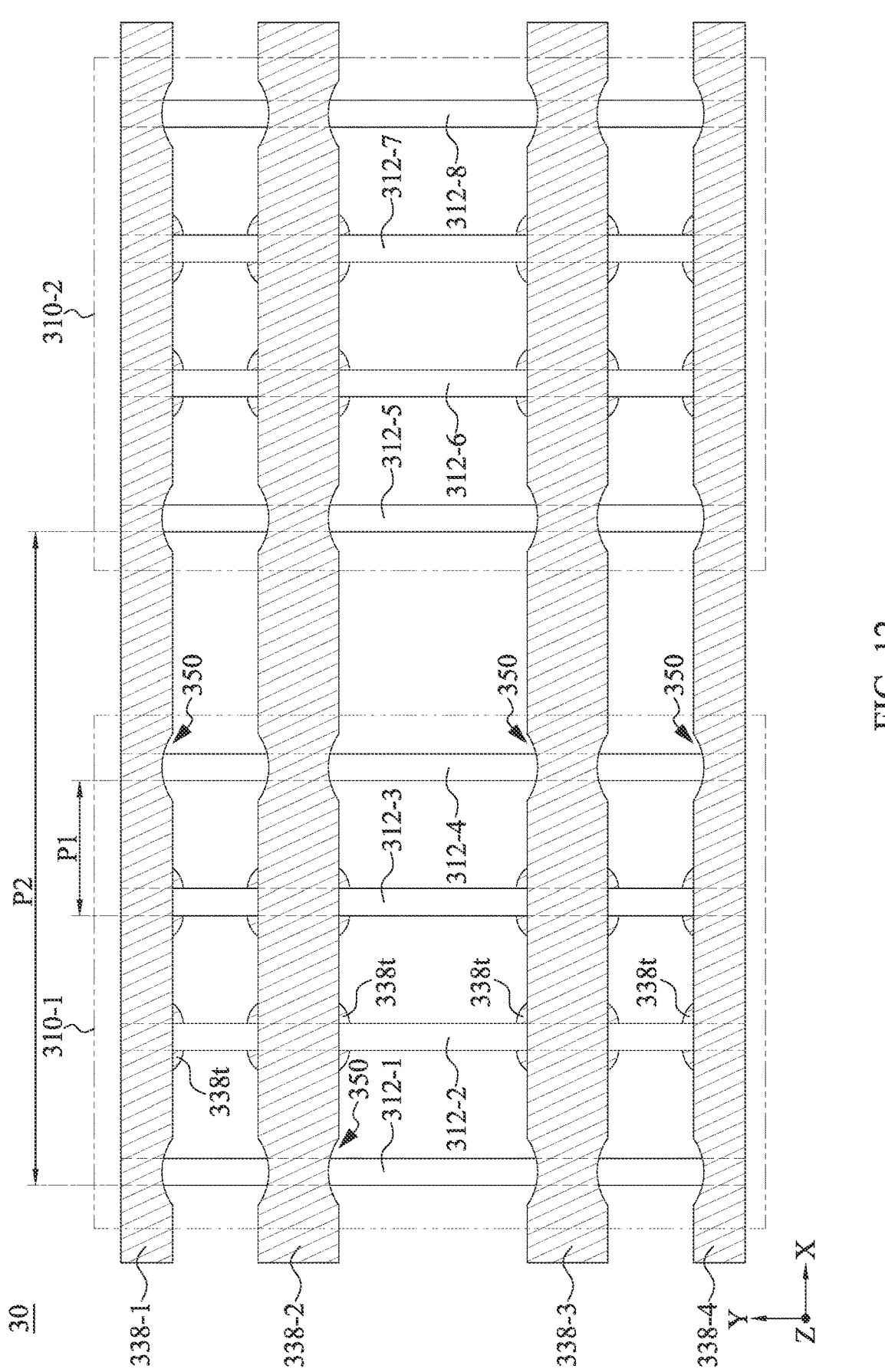
FIG. 12 is a top view of a semiconductor device, in accordance with some embodiments of the present disclosure.

FIG. 12 is a top view of a semiconductor device 30, in accordance with some embodiments of the present disclosure. It should be noted that some features (e.g., the gate dielectric and gate spacer) are omitted from FIG. 12 for brevity.

The semiconductor device 30 includes a fin group 310-1 and a fin group 310-2. The fin group 310-1 includes fins 312-1, 312-2, 312-3, and 312-4, each of which extends along the Y direction. The fins 312-1 and 312-4 are outer fins of the fin group 310-1. The fins 312-2 and 312-3 are intra-fins of the fin group 310-1. The fin group 310-2 includes fins 312-5, 312-6, 312-7, and 312-8, each of which extends along the Y direction. The fins 312-5 and 312-8 are outer fins of the fin group 310-2. The fin 312-5 abuts the fins 312-4 and 312-6. The fins 312-6 and 312-7 are intra-fins of the fin group 310-2. The fins 312-1 to 312-4 (or fins 312-5 to 312-8) define a pitch P1 which is a distance (or a length) between abutting fins (e.g., a distance between the sidewalls of the same side) belong the fin group 310-1. The fin groups 310-1 and 310-2 define a pitch P2 which is a distance (or a length) between fins located at corresponding locations of the fin groups 310-1 and 310-2 (e.g., a distance between the fin 312-1 and the corresponding fin 312-5). The pitch P2 is greater than the pitch P1. The semiconductor device 30 includes gate electrodes 338-1, 338-2, 338-3, and 338-4, each of which extends along the X direction and across the fins 312-1 to 312-8. In some conditions, over etching at the stage of removing the dummy gate electrodes may occur to the fins 312-1, 312-4, 312-5 and/or 312-8 if bamboo structures are formed. In some embodiments of the present disclosure, the profiles of the dummy gate electrodes may be modified so that the sidewall of the dummy gates define indentions adjacent to the fins 312-1, 312-4, 312-5, and 312-8 in a top view. As a result, the dummy gate electrodes have no bamboo structures on the fins 312-1, 312-4, 312-5, and 312-8. The gate electrodes 338-1 to 338-4 can inherit the profiles of the dummy gate electrodes so that the sidewalls of the gate electrodes 338-1 to 338-4 define indentions 350 (or recesses or notches) adjacent to the fins 312-1, 312-4, 312-5, and 312-8. Each of the gate electrodes 338-1 to 338-4 includes protruding portions 338t on the sidewalls of the fins 312-2, 312-3, 312-6, and 312-7.

Figure 13:
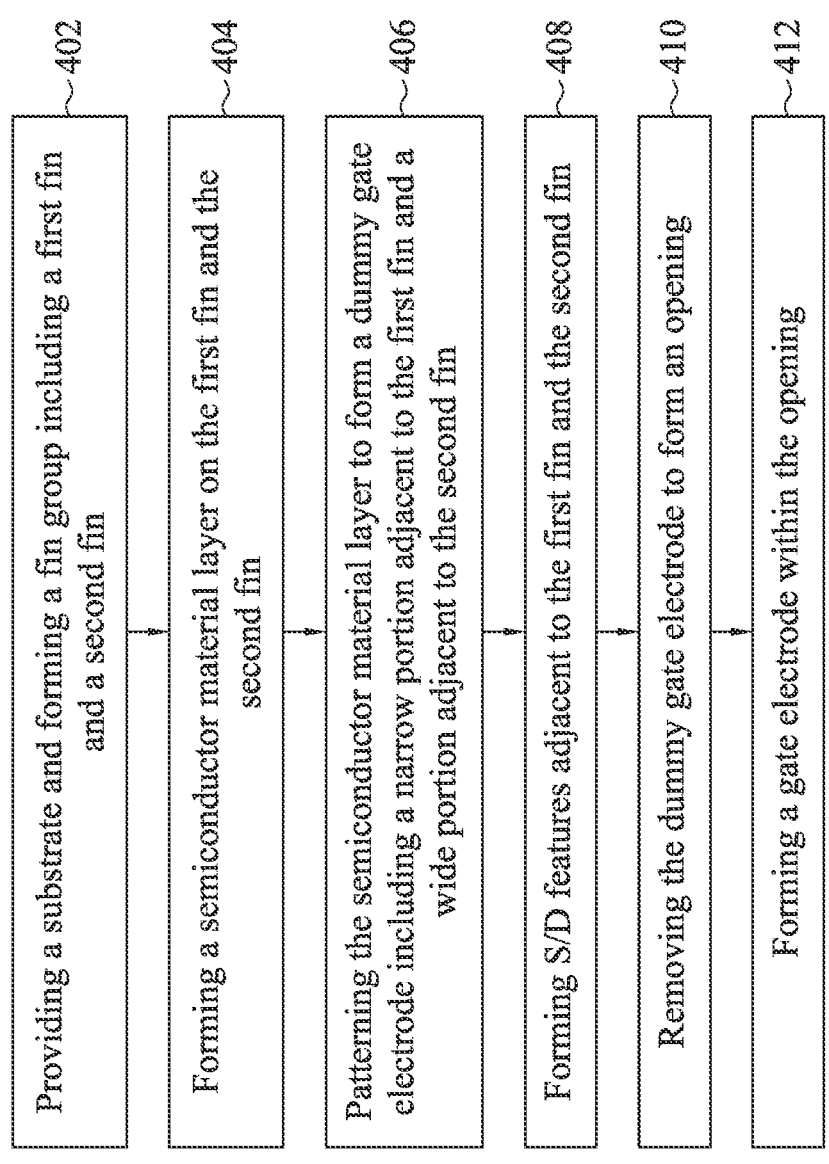
FIG. 13 is a flowchart of a method for manufacturing a semiconductor device according to various aspects of the present disclosure.

FIG. 13 is a flowchart of a method 40 for manufacturing a semiconductor device according to various aspects of the present disclosure.

The method 40 begins with operation 402 in which a substrate is provided. A fin group is formed over the substrate. The fin group includes a first fin and a second fin. The first fin is the outer fin of the fin group. The second fin is an intra-fin between the outer fins of the fin group. FIG. 1A and FIG. 1B illustrate the stage corresponding to operation 402.

The method 40 continues with operation 404 in which a semiconductor material layer is formed on the first fin and the second fin. FIG. 2A and FIG. 2B illustrate the stage corresponding to operation 404.

The method 40 continues with operation 406 in which the semiconductor material layer is patterned to form a dummy gate electrode. The dummy gate electrode includes a narrow portion adjacent to the first fin and a wide portion adjacent to the second fin. FIGS. 3A to 4A and FIGS. 3B to 4B illustrate the stage corresponding to operation 406.

The method 40 continues with operation 408 in which S/D features are formed adjacent to the first fin and the second fin. FIG. 6A and FIG. 6B illustrate the stage corresponding to operation 408.

The method 40 continues with operation 410 in which the dummy gate electrode is removed to form an opening. FIG. 8A and FIG. 8B illustrate the stage corresponding to operation 410.

The method 40 continues with operation 412 in which a gate electrode is formed within the opening. The gate electrode includes a narrow portion adjacent to the first fin and a wide portion adjacent to the second fin. FIG. 9A and FIG. 9B illustrate the stage corresponding to operation 412.

The method 40 is merely an example, and is not intended to limit the present disclosure beyond what is explicitly recited in the claims. Additional operations can be provided before, during, and after the method 40, and some operations described can be replaced, eliminated, or reordered for additional embodiments of the method.

Some embodiments of the present disclosure provide a semiconductor device. The semiconductor device includes a first fin and a gate electrode. The first fin extends along a first direction. The gate electrode has a sidewall extending along a second direction different from the first direction. The sidewall of the gate electrode defines an indentation adjacent to the first fin in a top view.

Some embodiments of the present disclosure provide a semiconductor device. The semiconductor device includes a first fin group and a gate electrode. The first fin group includes a first fin and a second fin abutting the first fin, each of which extends along a first direction. The first fin is the outer fin of the first fin group. The gate electrode extends along a second direction and across at least the first fin and the second fin of the first fin group. The gate electrode has a first narrow portion adjacent to the first fin.

Some embodiments of the present disclosure provide a method of manufacturing a semiconductor device. The method includes forming a fin group on a substrate, wherein the fin group includes a first fin and a second fin abutting the first fin. The first fin is the outer fin of the fin group. The method also includes forming a semiconductor material layer over the fin group. The method further includes patterning the semiconductor material layer to form a dummy gate electrode. The dummy gate electrode has a narrow portion adjacent to the first fin and a wide portion adjacent to the second fin.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first fin extending along a first direction; and
a gate electrode having a sidewall extending along a second direction different from the first direction,
wherein the sidewall of the gate electrode defines an indentation adjacent to the first fin in a top view.

2. The semiconductor device of claim 1, further comprising:
a second fin extending along the first direction, wherein the sidewall of the gate electrode further extends across the second fin, and the sidewall of the gate electrode defines a protruding portion adjacent to the second fin.

3. The semiconductor device of claim 1, further comprising:
a second fin extending along the first direction, wherein the gate electrode has a first length along the first direction adjacent to the first fin and a second length along the second direction adjacent to the second fin, wherein the first length is different form the second fin.

4. The semiconductor device of claim 3, wherein the first fin and the second fin are included in a fin group, and the first fin is an outer fin of the fin group.

5. The semiconductor device of claim 3, wherein the sidewall of the gate electrode and a sidewall of the first fin form an acute angle in a top view.

6. The semiconductor device of claim 5, wherein the acute angle is equal to or greater than about 30° and less than about 90°.

7. The semiconductor device of claim 5, wherein the sidewall of the gate electrode and a sidewall of the second fin form an obtuse angle in a top view.

8. The semiconductor device of claim 3, further comprising:
a gate dielectric disposed on the first fin, wherein the gate dielectric defines an indentation adjacent to the first fin in a top view.

9. The semiconductor device of claim 1, wherein the indentation overlaps the first fin along a third direction substantially orthogonal to the first direction and the second direction.

10. A semiconductor device, comprising:
a first fin group comprising a first fin and a second fin adjacent to the first fin, each of which extends along a first direction, wherein the first fin is an outer fin of the first fin group; and
a gate electrode extending along a second direction and across at least the first fin and the second fin of the first fin group,
wherein the gate electrode has a first narrow portion adjacent to the first fin.

11. The semiconductor device of claim 10, wherein the second fin is an intra-fin of the first fin group, and the gate electrode has a wide portion adjacent to the second fin.

12. The semiconductor device of claim 11, wherein the gate electrode has a middle portion between the first fin and the second fin, and a length of the middle portion is greater than a length of the first narrow portion along the first direction.

13. The semiconductor device of claim 12, wherein the length of the middle portion is less than a length of the wide portion along the first direction.

14. The semiconductor device of claim 10, further comprising:
a second fin group distinct from the first fin group, wherein a distance between the first fin group and the second fin group is greater than a pitch of the first fin group, and the second fin group comprises a third fin which is an outer fin of the second fin group, and the gate electrode has a second narrow portion adjacent to the third fin.

15. The semiconductor device of claim 10, wherein the gate electrode has a sidewall extending along the second direction, the sidewall of the gate electrode and a sidewall of the first fin form a first angle, and the sidewall of the gate electrode and a sidewall of the second fin form a second angle different from the first angle from a top view.

16. The semiconductor device of claim 15, wherein the first angle is less than the second angle.

17. The semiconductor device of claim 15, wherein the first angle is an acute angle.

18. The semiconductor device of claim 15, wherein the second angle is an obtuse angle.

19. A method of manufacturing a semiconductor device, comprising:

forming a fin group on a substrate, wherein the fin group comprises a first fin and a second fin abutting the first fin, and the first fin is an outer fin of the fin group;

forming a semiconductor material layer over the fin group; and patterning the semiconductor material layer to form a dummy gate electrode, wherein the dummy gate electrode has a narrow portion adjacent to the first fin and a wide portion adjacent to the second fin.

20. The method of claim 19, further comprising:

removing the dummy gate electrode; and forming a gate electrode having a narrow portion adjacent to the first fin and a wide portion adjacent to the second fin.

\* \* \* \* \*